US012690287B2

(12) United States Patent
Pyo et al.

(10) Patent No.: US 12,690,287 B2
(45) Date of Patent: Jul. 21, 2026

(54) IMAGE SENSOR

(71) Applicant: Samsung Electronics Co., Ltd., Suwon-si (KR)

(72) Inventors: Junghyung Pyo, Suwon-si (KR); Seunghwan Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 292 days.

(21) Appl. No.: 18/539,820

(22) Filed: Dec. 14, 2023

(65) Prior Publication Data

US 2024/0429259 A1     Dec. 26, 2024

(30) Foreign Application Priority Data

Jun. 21, 2023     (KR) ........................ 10-2023-0079483

(51) Int. Cl.
*H10F 39/00* (2025.01)

(52) U.S. Cl.
CPC ....... *H10F 39/807* (2025.01); *H10F 39/8053* (2025.01); *H10F 39/806* (2025.01)

(58) Field of Classification Search
CPC ............................. H10F 39/807; H10F 39/803
See application file for complete search history.

(56) References Cited

U.S. PATENT DOCUMENTS

| | | | |
|---|---|---|---|
| 9,768,215 | B2 | 9/2017 | Kikuchi |
| 10,347,688 | B2 | 7/2019 | Kim |
| 10,991,733 | B2 | 4/2021 | Hsieh |
| 11,075,236 | B2 | 7/2021 | Shiraishi et al. |
| 2016/0358963 | A1 | 12/2016 | Kikuchi |
| 2018/0158864 | A1 | 6/2018 | Kim |
| 2020/0235149 | A1 | 7/2020 | Shiraishi et al. |
| 2021/0082978 | A1 | 3/2021 | Hsieh |
| 2022/0246657 | A1 | 8/2022 | Lin et al. |
| 2022/0293659 | A1 | 9/2022 | Cho |
| 2022/0344384 | A1 | 10/2022 | Jung et al. |

*Primary Examiner* — Matthew L Reames
(74) *Attorney, Agent, or Firm* — Harness, Dickey & Pierce, P.L.C.

(57) ABSTRACT

An image sensor includes: a substrate including a first side configured to receive light and a second side that is opposite the first side; a pixel separating pattern configured to at least partially define a unit pixel in the substrate; a first photoelectric conversion layer and a second photoelectric conversion layer arranged in a first direction in the pixel separating pattern; a first separating pattern configured to at least partially define the first photoelectric conversion layer and the second photoelectric conversion layer in the substrate between the first photoelectric conversion layer and the second photoelectric conversion layer; a first grid pattern on the pixel separating pattern; and a second grid pattern on the first separating pattern and having a lower height than the first grid pattern.

20 Claims, 35 Drawing Sheets

IMAGE SENSOR

CROSS-REFERENCE TO RELATED APPLICATIONS

This application claims priority to and the benefit of Korean Patent Application No. 10-2023-0079483 filed in the Korean Intellectual Property Office on Jun. 21, 2023, the entire contents of which are incorporated herein by reference.

BACKGROUND

Field

The present inventive concepts relate to image sensors. More particularly, the present inventive concepts relate to image sensors for reducing loss of light.

Description of the Related Art

An image sensor is a semiconductor device for converting optical images into electrical signals. The image sensor may, for example, be classified into a charge coupled device (CCD) image sensor and a complementary metal oxide semiconductor (CMOS) image sensor realized in a CMOS process. The CMOS image sensor may also be abbreviated to be a CIS.

The CIS may convert light energy into electrical energy and may read image information. In detail, the CIS may convert analog video signals input through a lens into electrical video signals, and may be developed to transmit CMOS digital signals, which is different from the CCD image sensor for transmitting charges.

In further detail, the CIS includes pixels arranged in a two-dimensional manner (e.g., a two-dimensional array), the respective pixels use transistors, and signal charges generated by a photodiode may be converted into voltages in the respective pixels and may be output. The CIS may be manufactured by the commercial CMOS methods so research on the easily manufactured CIS are in active progress.

When manufacturing the CIS, there is a problem in that light inflow through a color filter is absorbed by a polysilicon region of DTI (Deep Trench Isolation), causing light loss in a structure in which one pixel includes two or more photodiodes.

SUMMARY

Some example embodiments of the present inventive concepts provide an image sensor for reducing an optical loss.

Some example embodiments of the present inventive concepts provide an image sensor for acquiring an auto focus (AF) separating ratio.

Some example embodiments of the present inventive concepts provide an image sensor that may include a substrate including a first side configured to receive light and a second side that is opposite the first side; a pixel separating pattern configured to at least partially define a unit pixel in the substrate; a first photoelectric conversion layer and a second photoelectric conversion layer arranged in a first direction in the pixel separating pattern; a first separating pattern configured to at least partially define the first photoelectric conversion layer and the second photoelectric conversion layer in the substrate, the first separating pattern between the first photoelectric conversion layer and the second photoelectric conversion layer; a first grid pattern on the pixel separating pattern; and a second grid pattern on the first separating pattern and having a lower height than the first grid pattern. The height of the second grid pattern may satisfy a range of $1/10$ to $1/4$ of the height of the first grid pattern.

The image sensor may include a first color filter on the first grid pattern and the second grid pattern and having a greater refractive index than the second grid pattern. A ratio of the refractive index of the second grid pattern to the refractive index of the first color filter on the second grid pattern may satisfy 0.40 to 0.95.

A refractive index of the second grid pattern may satisfy 1.0 to 1.6. The first grid pattern may include a lower first grid pattern and an upper first grid pattern on the lower first grid pattern.

The lower first grid pattern and the second grid pattern may have a same height. The lower first grid pattern and the upper first grid pattern may include different materials.

The image sensor may further include a third photoelectric conversion layer proximate to the first photoelectric conversion layer in a second direction in the unit pixel, and a fourth photoelectric conversion layer proximate to the second photoelectric conversion layer in the second direction, wherein the third photoelectric conversion layer and the fourth photoelectric conversion layer are at least partially defined by the first separating pattern. The first separating pattern may include a first sub-separating pattern and a second sub-separating pattern spaced at a particular (or, alternatively, predetermined) interval.

An area of the second grid pattern may be equal to or greater than an area of the first sub-separating pattern and the second sub-separating pattern. the pixel separating pattern may be configured to at least partially define an additional unit pixel in the substrate, the additional unit pixel including an additional first photoelectric conversion layer and an additional second photoelectric conversion layer arranged in the first direction in the pixel separating pattern; an additional first separating pattern configured to at least partially define the additional first photoelectric conversion layer and the additional second photoelectric conversion layer in the substrate, the additional first separating pattern between the additional first photoelectric conversion layer and the additional second photoelectric conversion layer; and a third grid pattern, the third grid pattern on at least one of the additional first photoelectric conversion layer of the additional unit pixel or the additional second photoelectric conversion layer of the additional unit pixel.

The third grid pattern may completely cover the at least one of the additional first photoelectric conversion layer and the additional second photoelectric conversion layer. The additional first separating pattern may include a first sub-separating pattern and a second sub-separating pattern spaced apart from each other at a particular interval, and the third grid pattern may be on at least part of the first sub-separating pattern or the second sub-separating pattern. The third grid pattern may completely cover the first sub-separating pattern and the second sub-separating pattern.

Some example embodiments of the present inventive concepts provide an image sensor that may include: a substrate including a first side configured to receive light and a second side that is opposite the first side; a pixel separating pattern configured to at least partially define a unit pixel in the substrate; a first photoelectric conversion layer and a second photoelectric conversion layer arranged in a first direction in the pixel separating pattern; a first separating pattern configured to at least partially define the first photoelectric conversion layer and the second photoelectric conversion layer in the substrate, the first separating pattern between the first photoelectric conversion layer and the second photoelectric conversion layer; and a first grid pattern on at least one of the first photoelectric conversion layer or the second photoelectric conversion layer. The first grid pattern may cover at least part of the first separating pattern. A second grid pattern may be between the first separating pattern and the first grid pattern.

Some example embodiments of the present inventive concepts provide an image sensor that may include: a substrate including a first side configured to receive light and a second side that is opposite the first side; a pixel separating pattern configured to at least partially define a unit pixel in the substrate; a first photoelectric conversion layer and a second photoelectric conversion layer arranged in a first direction in the pixel separating pattern; a first separating pattern configured to at least partially define the first photoelectric conversion layer and the second photoelectric conversion layer in the substrate, the first separating pattern between the first photoelectric conversion layer and the second photoelectric conversion layer; a surface insulation layer on each of the pixel separating pattern, the first photoelectric conversion layer, the second photoelectric conversion layer, and the first separating pattern; a first grid pattern on at least a first portion of the surface insulation layer on the pixel separating pattern; a second grid pattern on at least a second portion of the surface insulation layer on the first separating pattern and having a lower height than the first grid pattern; and a color filter on each of the first grid pattern and the second grid pattern, wherein a height of the second grid pattern satisfies $1/10$ to $1/4$ of a height of the first grid pattern.

The pixel separating pattern may be configured to at least partially define an additional unit pixel in the substrate, the additional unit pixel including an additional first photoelectric conversion layer and an additional second photoelectric conversion layer arranged in a first direction in the pixel separating pattern; an additional first separating pattern configured to at least partially define the additional first photoelectric conversion layer and the additional second photoelectric conversion layer in the substrate, the additional first separating pattern between the additional first photoelectric conversion layer and the additional second photoelectric conversion layer; and a third grid pattern on at least one of the additional first photoelectric conversion layer or the additional second photoelectric conversion layer.

The image sensor according to some example embodiments of the present inventive concepts includes the first grid pattern and the second grid pattern on the separating pattern to at least partially define the pixel separating pattern and the photoelectric conversion layers, thereby providing the image sensor with reduced loss of light.

The image sensor according to some example embodiments of the present inventive concepts has the above-described merits, and includes the unit pixels in which part of the photoelectric conversion layer is blocked, thereby providing the image sensor having acquired the auto focus (AF) separation ratio.

BRIEF DESCRIPTION OF THE DRAWINGS

FIG. 5 shows a layout diagram of an image sensor according to some example embodiments of the present inventive concepts.

DETAILED DESCRIPTION

Figure 1:
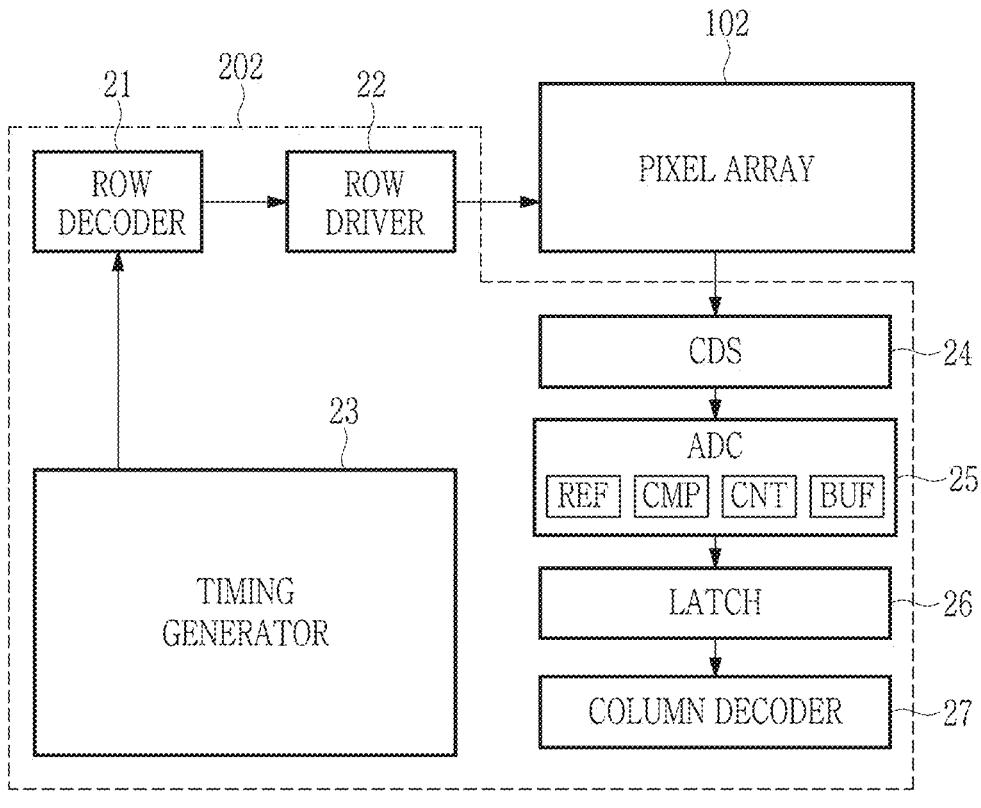
FIG. 1 shows a block diagram of an image sensor according to some example embodiments of the present inventive concepts.

The present inventive concepts will be described more fully hereinafter with reference to the accompanying drawings, in which embodiments of the inventive concepts are shown. As those skilled in the art would realize, the described embodiments may be modified in various different ways, all without departing from the spirit or scope of the present inventive concepts.

Parts that are irrelevant to the description will be omitted to clearly describe the present inventive concepts, and the same elements will be designated by the same reference numerals throughout the specification.

The size and thickness of each configuration shown in the drawings are arbitrarily shown for better understanding and ease of description, but the present inventive concepts are not limited thereto. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise", and variations such as "comprises" or "comprising", will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

Throughout the specification, when a part is "connected" to another part, it includes not only a case where the part is "directly connected" but also a case where the part is "indirectly connected" with another part in between. In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The use of the term "the" and similar demonstratives may correspond to both the singular and the plural. Operations constituting methods may be performed in any suitable order unless otherwise indicated herein or otherwise clearly contradicted by context and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Hereinafter, some example embodiments of the present inventive concepts will be described in detail so that those skilled in the art to which the present inventive concepts pertain may easily practice the present inventive concepts. However, the present inventive concepts may be implemented in various different forms and are not limited to the example embodiments provided herein.

FIG. 1 shows a block diagram of an image sensor according to some example embodiments of the present inventive concepts.

Referring to FIG. 1, a semiconductor chip including a pixel array 102 and a semiconductor chip including a logic circuit 202 may be stacked and disposed.

The pixel array 102 may convert incident light and may generate electrical signals (e.g., the pixel array 102 may photoelectrically convert incident light and may generate electrical signals based on the photoelectric conversion). The pixel array 102 may include unit pixel regions disposed in a matrix format in a row direction and a column direction. In detail, the pixel array 102 may be driven by control of the logic circuit 202. In further detail, the logic circuit 202 may control transistors included in the pixel array 102.

The logic circuit 202 may efficiently receive data from the pixel array 102 and may generate image frames. For example, the logic circuit 202 may use various types of methods such as a global shutter method for simultaneously sensing the unit pixel regions, a flutter shutter method for adjusting an exposure time for simultaneously sensing the entire unit pixel regions, a rolling shutter method for controlling the unit pixel regions for respective rows, or a coded rolling shutter method.

The logic circuit 202 may include a row decoder 21, a row driver 22, a timing generator 23, a correlated double sampler (CDS) 24, an analog to digital converter (ADC) 25, a latch portion (LATCH) 26, and a column decoder 27.

The row driver 22 may control the pixel array 102 according to control of the timing generator 23. The row driver 22 may select at least one of rows of the pixel array 102 according to a row address. The row driver 22 may decode the row address and may be connected to a selection transistor, a reset transistor, and a source follower transistor. The pixel array 102 may be driven by driving signals, such as a pixel selection signal, a reset signal, and a charge transmitting signal, received from the row driver 22.

The timing generator 23 provides a timing signal and a control signal to the row decoder 21 and the column decoder 27. The row driver 22 provides driving signals for driving unit pixels to the pixel array according to a result decoded by the row decoder 21. When the unit pixels are arranged in a matrix format, the driving signals are provided for respective rows of the matrix.

The correlated double sampler 24 receives output signals from the pixel array 102 and samples and holds the same. In detail, a difference level between a noise level and a signal level is output by double sampling a signal level caused by a specific noise level and an output signal.

The analog to digital converter 25 converts an analog signal that corresponds to the difference level into a digital signal and outputs the digital signal. In detail, the analog to digital converter 25 may convert analog signals received from the pixel array 102 through column lines into digital signals. The number of the analog to digital converters 25 may be determined by the number of the unit pixel regions disposed in one row and the number of column lines. The analog to digital converter 25 may be at least one as a nonlimited example.

The analog to digital converter 25 may include a reference signal generator REF, a comparator CMP, a counter CNT, and a buffer BUF. The reference signal generator REF may generate a lamp signal having a specific slope, and may provide the lamp signal as a reference signal of the comparator. The comparator CMP may compare the analog signal and the lamp signal of the reference signal generator REF and may output comparison signals having respective transition times according to valid signal components. The counter CNT may perform a counting operation to generate counting signals, and may provide them to the buffer BUF. The buffer BUF may include circuits of the latch portion 26 connected to the column lines, may latch the counting signal output by the counter CNT for respective columns in response to the transition of the comparison signal, and may output the latched counting signal as data.

Figure 2:
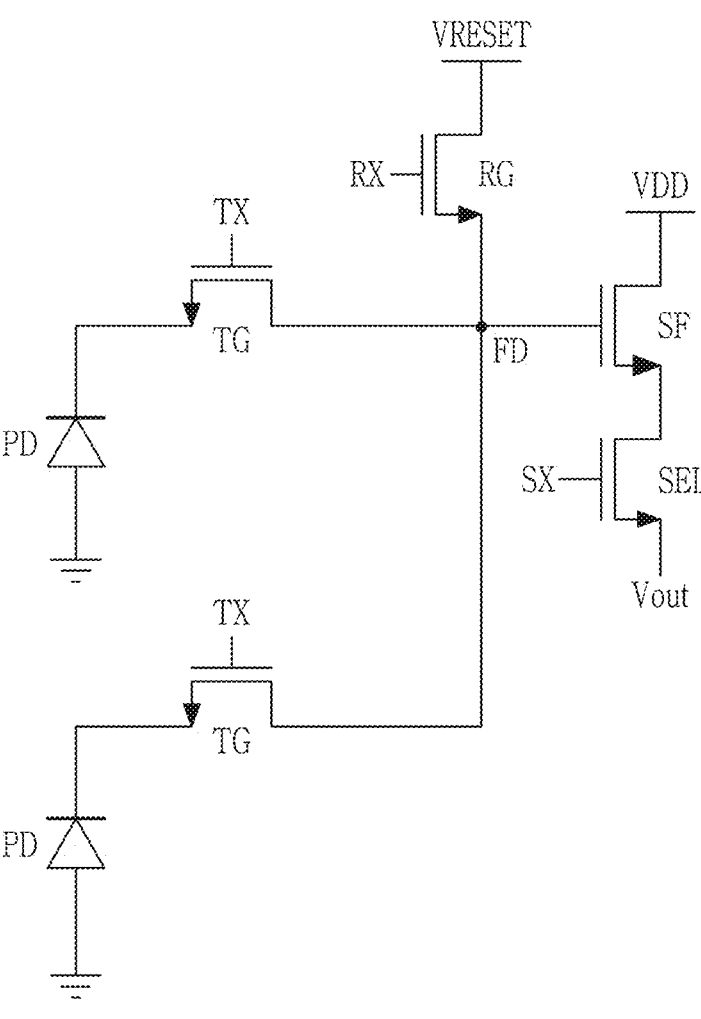
FIG. 2 shows a circuit diagram of a unit pixel region of a pixel array according to some example embodiments of the present inventive concepts.

FIG. 2 shows a circuit diagram of a unit pixel region of a pixel array according to some example embodiments of the present inventive concepts.

Referring to FIG. 2, the pixel array may include a photoelectric conversion layer PD, a transmission transistor TX, a floating diffusion region FD, and a reset transistor AX.

The photoelectric conversion layer PD may generate charges in proportion to an amount of light input from an outside (e.g., incident light received from an environment external to the pixel array, the image sensor, or the like). The photoelectric conversion layer PD may be a photodiode including an N-type impurity region and a P-type impurity region. The photoelectric conversion layer PD may be coupled to the transmission transistor TX for transmitting the generated and stored charges to the floating diffusion region FD. The floating diffusion region FD may have parasitic capacitance for converting charges to voltages and may stack and store charges.

A first end of the transmission transistor TX may be connected to the photoelectric conversion layer PD, and a second end of the transmission transistor TX may be connected to the floating diffusion region. The transmission transistor TX may be formed with a transistor driven by transmission signals that is a particular (or, alternatively, predetermined) bias. The transmission signal may be applied through a transmission gate TG. In detail, the transmission transistor TX may transmit the charges generated by the photoelectric conversion layers to the floating diffusion region FD according to the transmission signals.

The source follower transistor SX may amplify a change of electrical potential of the floating diffusion region FD having received the charges from the photoelectric conversion layer PD and may output the amplified change to an output line Vout. A particular (or, alternatively, predetermined) electrical potential, for example, a power source voltage VDD, provided to a drain of the source follower transistor SX may be transmitted to a drain region of the selection transistor. A source follower gate SF of the source follower transistor SX may be connected to the floating diffusion region FD.

The selection transistor may select the unit pixel region to be read per row unit. The selection transistor may be formed with a transistor driven by a particular (or, alternatively, predetermined) bias, for example, a selection line for applying a row selection signal. The row selection signal may be applied through a selection gate SEL.

The reset transistor RX may periodically reset the floating diffusion region FD. The reset transistor RX may be formed with a transistor driven by a particular (or, alternatively, predetermined) bias, for example, a reset line for applying a reset signal. The reset signal may be applied through a reset gate RG. The reset signal may be applied through the reset gate RG. When the reset transistor RX is turned on by the reset signal, a particular (or, alternatively, predetermined) electrical potential, for example, a power source voltage VDD, provided to the drain of the reset transistor RX may be transmitted to the floating diffusion region FD.

FIG. 2 shows that the photoelectric conversion layer PD electrically shares one floating diffusion region FD, which is a nonlimited example, and one unit pixel region may include one of at least one photoelectric conversion layer, and the floating diffusion region FD, and the transmission, source follower, selection, and reset transistors, and the reset transistor RX, the source follower transistor SX, or the selection transistor may be shared by the neighboring unit pixel regions.

In some example embodiments, as the area of the unit pixel region is reduced, the photoelectric conversion layer PD and the transmission transistor TX may be formed on one semiconductor chip, and the reset transistor, the source follower transistor, and the selection transistor may be formed on another semiconductor chip. The semiconductor chips may be arranged to configure a unit pixel region.

FIG. 2 shows some example embodiments in which the unit pixel includes photoelectric conversion layers PD, in detail, two photoelectric conversion layers PD, which is a non-limited example, and a unit pixel may, in some example embodiments, include a plurality of photoelectric conversion layers such as two photoelectric conversion layers PD or four photoelectric conversion layers PD.

In some example embodiments, the image sensor includes unit pixels. In detail, the unit pixels may be arranged in a matrix format in the row direction or the column direction. The respective unit pixels may include a photoelectric conversion layer PD, a floating diffusion region FD, and transmission, source follower, selection, and reset transistors, of which detailed descriptions are as described above.

Figure 3:
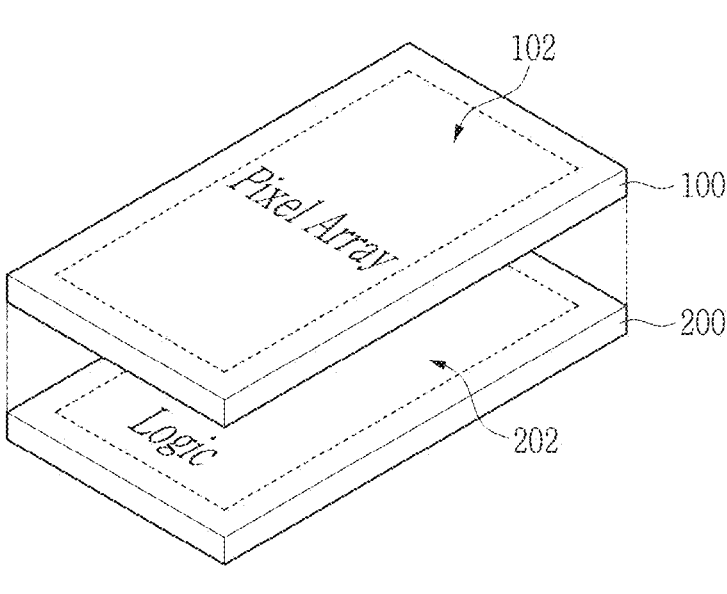
FIG. 3 shows an exploded perspective view of an image sensor according to some example embodiments of the present inventive concepts.
Figure 3:
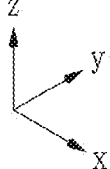

FIG. 3 shows an exploded perspective view of an image sensor according to some example embodiments of the present inventive concepts.

Referring to FIG. 3, the image sensor may include a first substrate structure 100 and a second substrate structure 200 that are stacked. The unit pixels may be arranged in a two-dimensional array structure on a plane including an X-axis direction and a Y-axis direction in the first substrate structure 100. In detail, the first substrate structure 100 may include a pixel array 102. The X-axis direction may be vertical to the Y-axis direction.

The second substrate structure 200 may include a structure such as a logic region Logic, which may include at least a portion of a logic circuit 202. The second substrate structure 200 may be disposed below the first substrate structure 100. The first substrate structure 100 may be electrically connected to the second substrate structure 200. The second substrate structure 200 may transmit the pixel signal provided from the first substrate structure 100 to the logic region of the second substrate structure 200.

The second substrate structure 200 may include a same member as the logic region Logic. The second substrate structure 200 may be disposed below the first substrate structure 100. The first substrate structure 100 may be electrically connected to the second substrate structure 200. The second substrate structure 200 may transmit the pixel signal provided from the first substrate structure 100 to the logic region of the second substrate structure 200.

Logic devices, including at least a portion of the logic circuit 202, may be disposed in the logic region of the second substrate structure 200. The logic devices may include circuits for processing pixel signals received from the unit pixels.

The first substrate structure 100 and the second substrate structure 200 may be stacked in a Z-axis direction. The Z-axis direction may be vertical (e.g., perpendicular) to the X-axis direction and the Y-axis direction.

Figure 4:
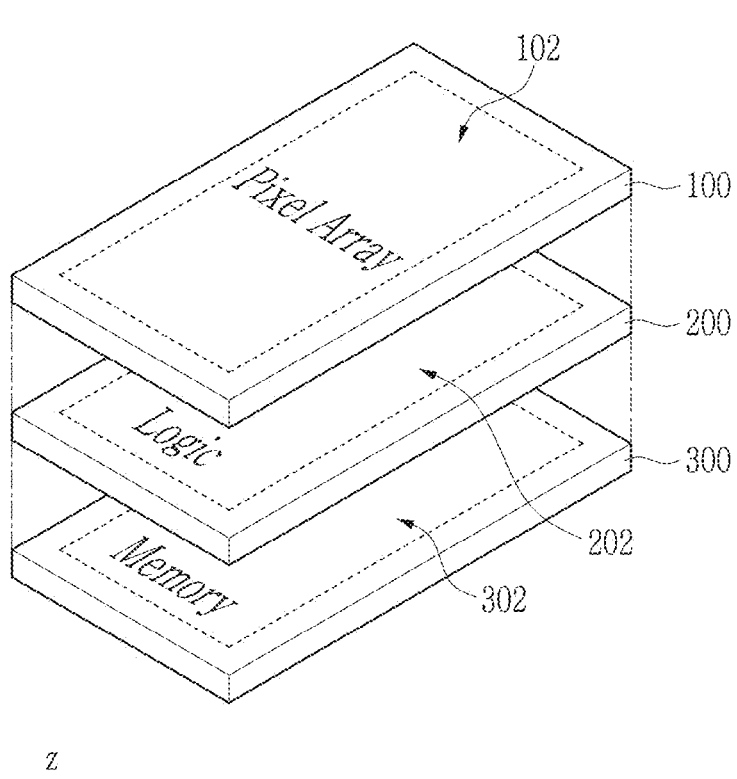
FIG. 4 shows an exploded perspective view of an image sensor according to some example embodiments of the present inventive concepts.

FIG. 4 shows an exploded perspective view of an image sensor according to some example embodiments of the present inventive concepts.

Referring to FIG. 4, the image sensor may further include a third substrate structure 300. The first substrate structure 100, the second substrate structure 200, and the third substrate structure 300 may be sequentially stacked in the Z-axis direction. The third substrate structure 300 may be disposed below the second substrate structure 200. In detail, the second substrate structure 200 may be disposed between the first substrate structure 100 and the third substrate structure 300. As described herein, a substrate structure may be interchangeably referred to as a substrate. Detailed descriptions on the first substrate structure 100 and the second substrate structure 200 are identical unless they are inconsistent within the range of what is described with FIG. 3.

The third substrate structure 300 may include a memory device 302. The third substrate structure 300 may, for example, include a volatile memory device such as a DRAM or an SRAM. The third substrate structure 300 may receive signals from the first substrate structure 100 and the second substrate structure 200 and may process the signals through the memory device. In some example embodiments, the memory device 302 may be included as a portion of the logic circuit 202, such that the logic circuit 202 is collectively provided by the logic region of the second substrate structure 200 and the memory device of the third substrate structure 300.

Figure 5:
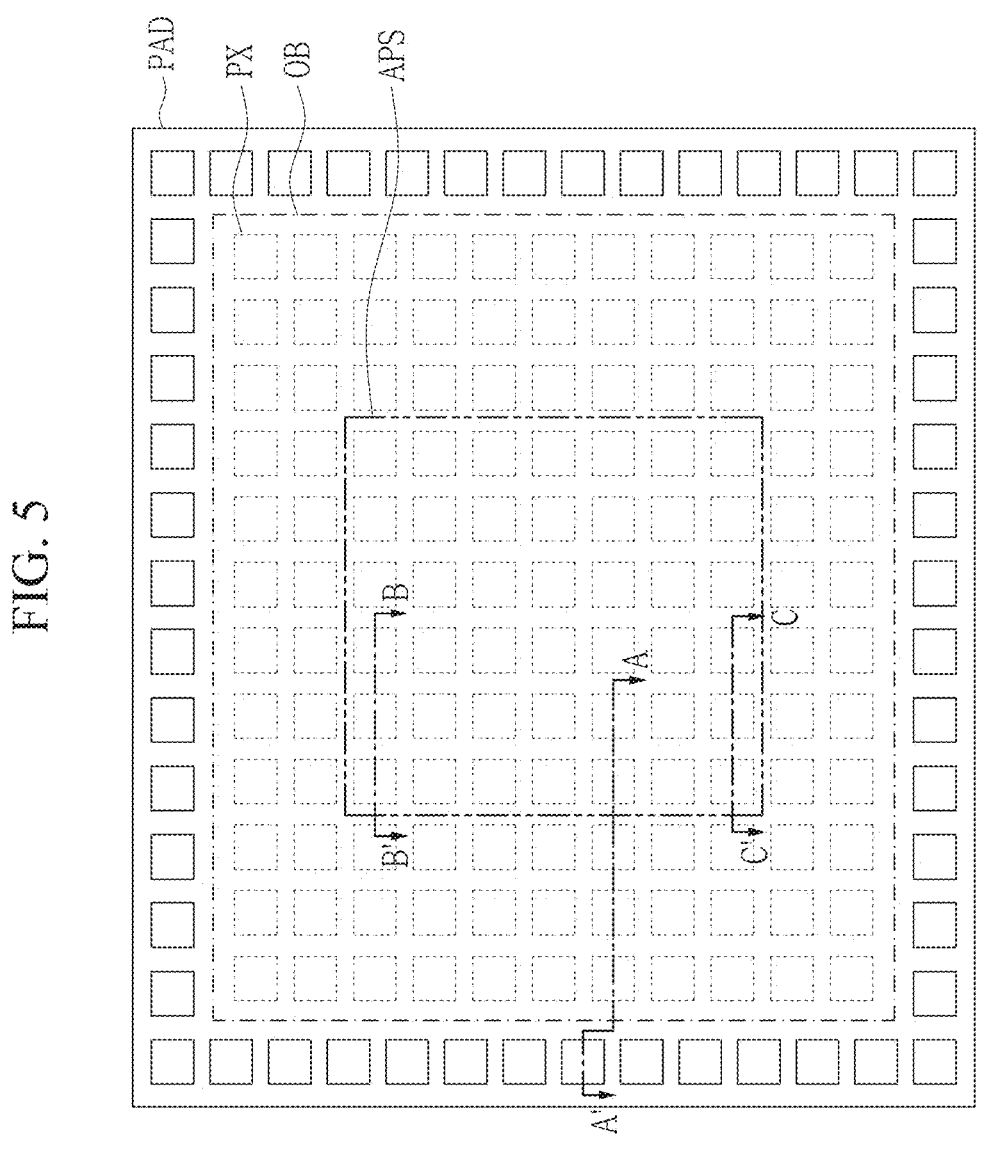
Figure 6:
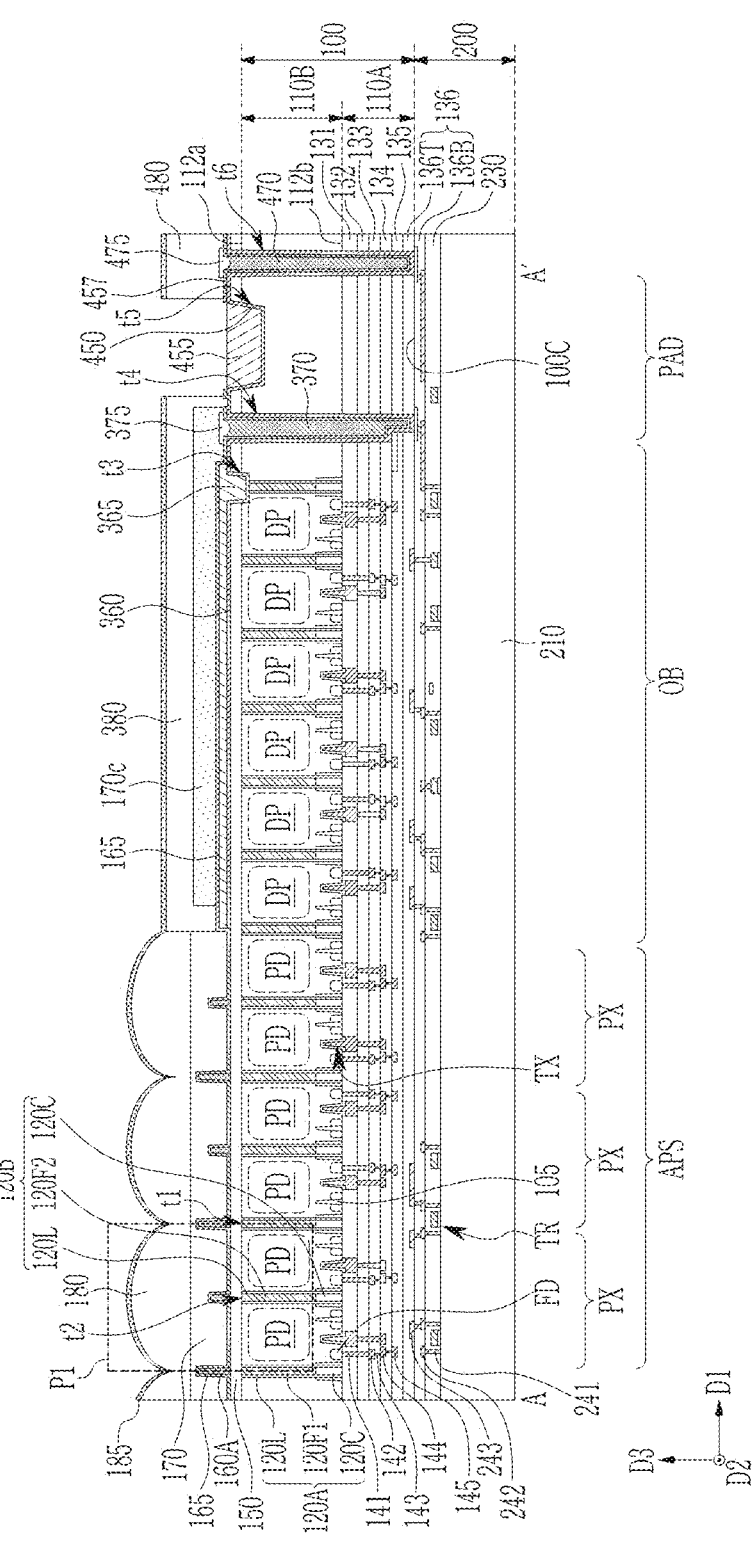
FIG. 6 shows a cross-sectional view of an image sensor with respect to a cross-sectional view line A-A' in FIG. 5 according to some example embodiments of the present inventive concepts.

FIG. 5 shows a layout diagram of an image sensor according to some example embodiments of the present inventive concepts. FIG. 6 shows a cross-sectional view with respect to a cross-sectional view line A-A' in FIG. 5.

Referring to FIG. 5 and FIG. 6, the image sensor may include a first substrate structure 100 and a second substrate structure 200. The first substrate structure 100 and the second substrate structure 200 may respectively be a sensor chip and a logic chip.

The first substrate structure 100 may include a light receiving region APS, a light blocking region OB, and a pad region PAD. Unit pixel regions PX arranged in a two-dimensional manner, for example, a matrix form may be formed in the light receiving region APS and the light blocking region OB. The unit pixel region PXs may be arranged in a matrix form on a plane on which a first direction D1 and a second direction D2 extend. They may be arranged in a matrix form on a plane on which the first direction D1 and the second direction D2 extend. The first direction D1 may traverse the second direction D2. The first direction D1 may be substantially vertical to the second direction D2. For example, the first direction D1 may be perpendicular to the second direction D2. A third direction D3 may be substantially vertical to the first direction D1 and the second direction D2. For example, the third direction D3 may be perpendicular to both the first direction D1 and the second direction D2. The third direction D3 may be referred to herein interchangeably as a vertical direction and may be referred to as being perpendicular to an in-plane direction of the first substrate structure 100, the upper substrate 1101B, the lower substrate 110A, or the like, where the in-plane direction may include the first and/or second directions D1 and/or D2.

Active pixels for receiving light and generating active signals may be arranged in the light receiving region APS. Optical black pixels for blocking light and generating optical black signals may be arranged in the light blocking region OB. The light blocking region OB may be formed around the light receiving region APS (e.g., at least partially or entirely surrounding the light receiving region APS in a plane extending in the first and second directions D1 and D2) as a nonlimited example.

In some example embodiments, dummy unit pixel regions (DP) may be formed in the light blocking region OB. The dummy unit pixel region may be a pixel generating no active signal.

The pad region PAD may be formed around the light blocking region OB (e.g., at least partially or entirely surrounding the light blocking region OB in a plane extending in the first and second directions D1 and D2). The pad region PAD may be formed near an edge of the image sensor as a nonlimited example. The pad region PAD may be connected to a member such as an external device, and may be configured to transmit and receive electrical signals between the image sensor and the external device. In detail, a second pad pattern 455 may be connected to the member such as the external device on an upper substrate 110B of the pad region PAD.

In some example embodiments, the image sensor may include a first substrate structure 100 including an upper substrate 110B and a lower substrate 110A, a pixel separating pattern 120A, a surface insulation layer 150, a first color filter 170, a first grid pattern 160A, a micro lens 180, and a second substrate structure 200 disposed below the first substrate structure 100 and including a second substrate 210.

The upper substrate 110B may be a semiconductor substrate. In detail, the upper substrate 110B may be bulk silicon or a silicon-on-insulator (SOI). The upper substrate 110B may be a silicon substrate. The upper substrate 110B may, for example, be made of a material including silicon, silicon germanium, an indium antimonide, a lead telluride compound, an indium arsenide, an indium phosphide, a gallium arsenide, or a gallium antimonide. In some example embodiments, the upper substrate 110B may be an epitaxial layer formed on a base substrate.

The upper substrate 110B may include a first side 112a and a second side 112b facing each other. In some example embodiments, the first side 112a of the upper substrate 110B may be a light receiving side. In some example embodiments, the image sensor may be a back side illumination (BSI) image sensor.

Unit pixel regions PX may be formed in the upper substrate 110B of the light receiving region APS and the light blocking region OB. Referring to at least FIGS. 7A, 7B, and 8A to 8C, the respective unit pixel regions PX may include a first photoelectric conversion layer PD1 and a second photoelectric conversion layer PD2. In some example embodiments, the dummy unit pixel region (DP) including no first photoelectric conversion layer PD1 and second photoelectric conversion layer PD2 (e.g., not including any photoelectric conversion layers) may be further included in the upper substrate 110B of the light blocking region OB, but example embodiments are not limited thereto. The signal generated by the dummy unit pixel region may be used as information for removing processing noise.

The respective unit pixel regions PX may include a photoelectric conversion layer PD, a floating diffusion region FD, and a transmission transistor TX. In detail, the photoelectric conversion layer PD1 or PD2 may be formed in the upper substrate 110B of the light receiving region APS and the light blocking region OB. The photoelectric conversion layer PD1 or PD2 may generate charges in proportion to the amount of light input from the outside. The photoelectric conversion layer PD1 or PD2 may transmit the generated and stored charges to the floating diffusion region FD.

The floating diffusion region FD may be formed in the upper substrate 110B of the light receiving region APS and the light blocking region OB. The floating diffusion region FD may be formed in (e.g., formed at) the second side 112b of the upper substrate 110B. The charges transmitted to the floating diffusion region FD may be applied to the source follower gate SF of FIG. 2.

The transmission transistor TX may be filled in the upper substrate 110B. A first end of the transmission transistor TX may be connected to the first photoelectric conversion layer PD1 or the second photoelectric conversion layer PD2, and a second end of the transmission transistor TX may be connected to the floating diffusion region FD. The transmission transistor TX may transmit the charges generated by the first photoelectric conversion layer PD1 or the second photoelectric conversion layer PD2 to the floating diffusion region FD.

The transmission transistor TX may include a transmission gate, a gate insulating layer, and a gate spacer. The transmission gate may include a portion filled in the upper substrate 110B. The gate insulating layer may be disposed between the transmission gate and the upper substrate 110B. The gate spacer may be disposed on both sidewalls of the transmission gate.

The pixel separating pattern 120A may be formed in the upper substrate 110B. The pixel separating pattern 120A may be formed when a conducting material is filled in a deep trench formed by patterning the upper substrate 110B, and may be insulated when a liner layer that is an insulating material is formed between the conducting material and the upper substrate 110B.

The pixel separating pattern 120A may penetrate the upper substrate 110B in a third direction D3. In detail, the pixel separating pattern 120A may extend to the first side 112a from the second side 112b. In further detail, the pixel separating pattern 120A may be a front deep trench isolator (FDTI).

The pixel separating pattern 120A may define (e.g., at least partially define or completely define) the unit pixel regions PX (e.g., in the first, second, and/or third directions D1, D2, and/or D3). In some example embodiments, the pixel separating pattern 120A may define the unit pixel regions PX and the dummy unit pixels (not shown). The pixel separating pattern 120A may be formed to have a lattice shape in a plan view and may separate the unit pixel regions PX from each other (e.g., in the first and second directions D1 and D2). The pixel separating pattern 120A may have a lattice structure extending in the first direction D1 and the second direction D2.

In a cross-sectional view, the pixel separating pattern 120A may penetrate the upper substrate 110B in the third direction D3. The pixel separating pattern 120A may extend to the first side 112a from the second side 112b of the upper substrate 110B. The pixel separating pattern 120A may be a deep trench isolation (DTI) film. A width of the pixel separating pattern 120A in the second direction D2 may gradually decrease or may have a same width when approaching the first side 112a from the second side 112b of the upper substrate 110B in the third direction D3. However, the technical scope of the present inventive concepts is not limited thereto.

The pixel separating pattern 120A may include a liner layer 120L, a first pixel separating filling film 120F1, and a capping film 120C. The liner layer 120L may be disposed on a sidewall and a bottom side of the first trench t1. In some example embodiments, the bottom side of the first trench t1 represents a side that faces the first side 112a of the upper substrate 110B. The first pixel separating filling film 120F1 may be disposed on the liner layer 120L. The capping film 120C may be disposed on the first pixel separating filling film 120F1.

The liner layer 120L may include an oxide layer with a refractive index that is lower than that of the upper substrate 110B. The liner layer 120L may, as a nonlimited example, include at least one of a silicon oxide, an aluminum oxide, a tantalum oxide, or any combination thereof.

The liner layer 120L with the refractive index that is lower than that of the upper substrate 110B may refract light obliquely input to the first photoelectric conversion layer PD1 or the second photoelectric conversion layer PD2. The liner layer 120L may prevent photocharges generated in a specific unit pixel region PX by incident light from moving to the adjacent unit pixel region PX according to a random drift. In detail, the liner layer 120L may increase the light receiving rate of the first photoelectric conversion layer PD1 and the second photoelectric conversion layer PD2 and may improve quality of the image sensor.

The first pixel separating filling film 120F1 may include an insulating material or a conducting material. The insulating material may include a silicon-based insulating material such as a silicon nitride, a silicon oxide, or a silicon oxynitride, and a high-dielectric material such as a hafnium oxide, an aluminum oxide, or a tantalum oxide. In some example embodiments, the first pixel separating filling film 120F1 may be a low-resistance conducting material. As a nonlimited example, the conducting material may include silicon to which polysilicon (Poly Si), arsenide (As), phosphorus (P), or carbon (C) is doped.

In some example embodiments, a negative voltage may be applied to the first pixel separating filling film 120F1 including a conducting material. Accordingly, electrostatic discharge (ESD) bruise defects of the image sensor may be efficiently prevented. The ESD bruise defects represent a phenomenon of generating stains such as images or bruises when the charges generated by the reaction such as the ESD are stacked on the surface of the substrate, for example, the first side 112a.

The capping film 120C may include an insulating material. For example, the capping film 120C may include a silicon-based insulating material such as a silicon nitride, a silicon oxide, or a silicon oxynitride, and a high dielectric material such as a hafnium oxide or an aluminum oxide. The capping film 120C may, as a nonlimited example, include the same material as the first capping pattern 375 and the second capping pattern 475.

In some example embodiments, a first separating pattern 120B for defining (e.g., configured to at least partially define) the first photoelectric conversion layer PD1 and the second photoelectric conversion layer PD2 may be included on the first substrate structure 100 (e.g., in the first substrate structure 100, the upper substrate 110B, etc.) and between the first photoelectric conversion layer PD1 and the second photoelectric conversion layer PD2 (e.g., between the first photoelectric conversion layer PD1 and the second photoelectric conversion layer PD2 in a horizontal direction such as the first direction D1). The first separating pattern 120B may include a liner layer 120L, a first separating filling film 120F2, and a capping film 120C. The liner layer 120L may be disposed on a sidewall and a bottom side of a second trench t2. In some example embodiments, the bottom side of the second trench t2 faces the first side 112a of the upper substrate 110B. The first separating filling film 120F2 may be disposed on the liner layer 120L. The capping film 120C may be disposed on the first separating filling film 120F2. The first separating pattern 120B is equivalent to the pixel separating pattern 120A except that the first photoelectric conversion layer PD1 and the second photoelectric conversion layer PD2 are separated in the unit pixel region PX within a range of noncontradiction.

In some example embodiments, a trench isolation pattern 105 may be provided. The trench isolation pattern 105 may be disposed in the upper substrate 110B. For example, the trench isolation pattern 105 may be disposed in the trench from which a portion of the upper substrate 110B is recessed. In detail, the trench may be recessed from the second side 112b of the upper substrate 110B. The trench isolation pattern 105 may be a shallow trench isolation (STI) film. The trench isolation pattern 105 may define active regions.

A width of the trench isolation pattern 105 in the first direction D1 or the second direction D2 may gradually decrease when approaching the first side 112a from the second side 112b of the upper substrate 110B. The trench isolation pattern 105 may overlap the pixel separating pattern 120A in the second direction D2 or the first direction D1. The pixel separating pattern 120A may penetrate the trench isolation pattern 105 in the third direction D3. The trench isolation pattern 105 may include an insulating material. The insulating material may, for example, include at least one of a silicon nitride, a silicon oxide, and a silicon oxynitride.

The trench isolation pattern 105 may define the active regions. The active regions may, as a nonlimited example, have a linear shape extending in the second direction D2 in a plan view. A floating diffusion region FD, a transmission transistor TX, a selection transistor, a reset transistor RX, and a source follower transistor SX may be provided in the active regions. In detail, the transmission transistor TX may include a transmission gate TG.

In some example embodiments, the floating diffusion region FD may be provided to one side of the transmission transistor TX. The floating diffusion region FD may have conductivity that is opposite to the upper substrate 110B. For example, N-type impurities may be doped into the floating diffusion region FD. The floating diffusion region FD may cover the transmission gate TG of the transmission transistor TX.

In some example embodiments, part of the unit pixel region PX may include a selection transistor and a source follower transistor SX. The selection transistor may include a selection gate SEL, and the source follower transistor SX may include a source follower gate SF. Other part of the unit pixel region PX may include a reset transistor RX. The reset transistor RX may include a reset gate RG. However, a technical scope of the present inventive concepts are not limited thereto, and the disposition and the number (e.g., quantity) of the transistors included in the unit pixel region PX are changeable in many ways.

In some example embodiments, the image sensor may further include first line insulation layers 131, 132, 133, 134, 135, and 136. The first line insulation layers 131, 132, 133, 134, 135, and 136 may cover the second side 112b of the upper substrate 1101B. The upper substrate 110B and first line insulation layers 131, 132, 133, 134, 135, and 136 may configure the first substrate structure 100. FIG. 6 shows the first line insulation layers 131, 132, 133, 134, 135, and 136, and without being limited thereto, the number of layers of the first line insulation layers is not limited thereto.

The first line insulation layers 131, 132, 133, 134, 135, and 136 may, for example, may include at least one of a silicon oxide, a silicon nitride, a silicon oxynitride, and a low dielectric constant (Low-k) material with a dielectric constant that is lower than that of the silicon oxide.

In some example embodiments, the first line insulation layer 136 connects the upper substrate 110B and the lower substrate 110A, and may be classified into an upper insulation layer 136T and a lower insulation layer 136B. The upper insulation layer 136T and the lower insulation layer 136B may be made of a same film material, and may be divided by an interface to which the upper substrate 110B and the lower substrate 110A are connected.

First contacts 141 and 143 and first wire patterns 142, 144, and 145 may be provided in the first line insulation layers 131, 132, 133, 134, 135, and 136. The first contacts 141 and 143 may electrically connect the floating diffusion region FD and the first wire patterns 142, 144, and 145. Some of the first wire patterns 142, 144, and 145 may be connected to a first connection structure 360. This is a nonlimited example, the first contacts 141 and 143 may be connected to the first wire patterns 142, 144, and 145 in many forms, and their numbers are not limited thereto.

The first contacts 141 and 143 and the first wire patterns 142, 144, and 145 may, as a nonlimited example, include at least one of tungsten (W), copper (Cu), aluminum (Al), gold (Au), silver (Ag), and their alloys.

The second substrate 210 is one of constituent elements of the second substrate structure 200 disposed below the first substrate structure 100, and it may be bulk silicon or a silicon-on-insulator (SOI). The second substrate 210 may be a silicon substrate. The second substrate 210 may, for example, include silicon germanium, an indium antimonide, a lead telluride compound, indium arsenide, indium phosphide, gallium arsenide, or a gallium antimonide. The second substrate 210 may have an epitaxial layer formed on the base substrate.

Transistors TR may be formed on an upper side of the second substrate 210. The transistor TR may control the transmission transistor TX, the reset transistor RX, the selection transistor, and the source follower transistor SX.

A second line insulation layer 230 may be formed on the second substrate 210. For example, the second line insulation layer 230 may cover the upper side of the second substrate 210. An upper side of the second line insulation layer 230 may contact the third side 100c that is a lower side of the lower substrate 110A of the first substrate structure 100 and may be combined to the same. The second line insulation layer 230 may, as a nonlimited example, include at least one of a silicon oxide, a silicon nitride, a silicon oxynitride, and a low dielectric constant (low-k) material with a dielectric constant that is lower than that of the silicon oxide.

A second contact 241 and second wire patterns 242 may be disposed in the second line insulation layer 230. The second contact 241 may connect the second wire patterns 242, the second wire patterns 242 may be connected to the transistors TR and may be connected to the floating diffusion region FD of the first substrate structure 100. For example, some of the second wire patterns 242 may be connected to the first connection structure 360. Others of the second wire patterns 242 may be connected to a second connection structure 450.

The second contact 241 and the second wire patterns 242 may, as a nonlimited example, include at least one of tungsten (W), copper (Cu), aluminum (Al), gold (Au), silver (Ag), and their alloys, but are not limited thereto.

The surface insulation layer 150 may be formed on the first side 112a of the upper substrate 110B. The surface insulation layer 150 may extend along the second side 112b of the upper substrate 1101B. In some example embodiments, at least part of the surface insulation layer 150 may contact the pixel separating pattern 120A and the first separating pattern 120B. Here, a lower side of the surface insulation layer 150 may smoothly contact the pixel separating pattern 120A and the first separating pattern 120B.

The surface insulation layer 150 may include an insulating material. For example, the surface insulation layer 150 may include at least one of a silicon oxide, a silicon nitride, a silicon oxynitride, an aluminum oxide, a hafnium oxide, a titanium oxide, a tantalum oxide, or any combination thereof, and is not limited thereto.

The surface insulation layer 150 may function as an anti-reflection film to prevent reflection of light input to the upper substrate 1101B, and allows easy inputting of the incident light to increase the light receiving rates of the first photoelectric conversion layer PD1 and the second photoelectric conversion layer PD2. Further, the surface insulation layer 150 may function as a planarization layer, and may form the first color filter 170 and the micro lens 180 to have a uniform height without distortion.

The first color filter 170 may be formed on the surface insulation layer 150 of the light receiving region APS. In some example embodiments, the first color filter 170 may be formed on the surface insulation layer 150 of the light receiving region APS. In some example embodiments, the first color filter 170 may be arranged to correspond to the respective unit pixel regions PX. In detail, the first color filters 170 may be arranged in the two-dimensional way, for example, in a matrix form.

The first color filter 170 may have various color filters according to the unit pixel region PX. For example, the first color filter 170 may be arranged as a Bayer pattern including a red color filter, a green color filter, and a blue color filter. This is a nonlimited example, and the first color filter 170 may include a yellow filter, a magenta filter, and a cyan filter, and may further include a white filter.

The first grid pattern 160A may be formed on the surface insulation layer 150 and thus may be on the pixel separating pattern 120A. The first grid pattern 160A may be formed to have a lattice shape on a plane (e.g., a horizontal plane extending in the first and second directions D1 and D2) and may be provided among the first color filters 170. The first grid pattern 160A may increase quality of the image sensor (e.g., increase quality of images generated by the image sensor and thus improve functionality of the image sensor) by refracting or reflecting light obliquely input to the image sensor, thereby reducing loss of incident light to the photoelectric conversion layers PD to absorbance by elements of the image sensor other than the photoelectric conversion layers PD and thus improving the sensitivity (e.g., improving absorbance and photoelectric conversion) of the image sensor to incident light.

The first grid pattern 160A may include a metallic material for reflecting light or a material with a low refractive index that is lower than the refractive index of silicon (Si). For example, the first grid pattern 160A may include at least one of a tungsten metal, an aluminum metal, a titanium metal, a titanium nitride metal, a silicon oxide, a silicon oxide having collected an air layer, a polymer material with a low refractive index, or any combination thereof, which is not limited thereto. As the first grid pattern 160A has a lower refractive index than the silicon (Si), light may be prevented from being absorbed into the liner layer 120L, or such absorbance may be reduced or minimized. As a result, loss of incident light to structures of the image sensor other than the photoelectric conversion layers PD may be reduced, minimized, or prevented, and therefore the image sensor may be configured to improve the amount and/or proportion of incident light received at the image sensor which is absorbed and photoelectrically converted by the photoelectric conversion layers, thereby improving the sensitivity of the image sensor to incident light, improving the quality of images generated by the image sensor based on the incident light, and the like.

In some example embodiments, a second grid pattern 160B disposed on the first separating pattern 120B may be included. As shown, the first grid pattern 160A may be on at least a first portion of the surface insulation layer 150 on the pixel separating pattern 120A, and the second grid pattern 160B may be on at least a second, separate portion of the surface insulation layer 150 on the first separating pattern 120B. In detail, the second grid pattern 160B may include a metallic material for reflecting light or a material with a low refractive index that is lower than the refractive index of silicon (Si). For example, the second grid pattern 160B may include at least one of a tungsten metal, an aluminum metal, a titanium metal, a titanium nitride metal, a silicon oxide, a silicon oxide having collected an air layer, a polymer material with a low refractive index, or any combination thereof, which is not limited thereto.

In some example embodiments, first grid pattern 160A may have the same material as the second grid pattern 160B or may have a different material from the same. When the first grid pattern 160A and the second grid pattern 160B have a same material, and light input from the first color filter 170 is reflected at the first grid pattern 160A and the second grid pattern 160B, the light may be reflected with a same angle so that it may be easily input to (and thus absorbed and/or photoelectrically converted by) the photoelectric conversion layers PD1 and PD2.

When the first grid pattern 160A and the second grid pattern 160B have different materials, and the light input from the first color filter 170 is reflected at the first grid pattern 160A and the second grid pattern 160B, the amount of light input to (and thus absorbed and/or photoelectrically converted by) the photoelectric conversion layers PD1 and PD2 may be increased or maximized by changing the angle at which the incident light is reflected by the first grid pattern 160A and/or the second grid pattern 160B.

In some example embodiments, a first protective layer 165 may be formed on the surface insulation layer 150, the first grid pattern 160A, and the second grid pattern 160B. The first protective layer 165 may be provided between the surface insulation layer 150 and the first color filter 170 and among the first grid pattern 160A, the second grid pattern 160B, and the first color filter 170. For example, the first protective layer 165 may prevent the surface insulation layer 150, the first grid pattern 160A, and the second grid pattern 160B from being damaged.

The micro lens 180 may be formed on the first color filter 170. The micro lens 180 may be arranged to correspond to the respective unit pixel regions PX. For example, the micro lens 180 may be arranged in a two-dimensional way, for example, in a matrix form on a plane.

The micro lens 180 may have a convex shape, and may have a curvature radius within a particular (or, alternatively, predetermined) range. With the curvature radius within the particular (or, alternatively, predetermined) range, the micro lens 180 may condense light input to the photoelectric conversion layers PD1 and PD2. For example, the micro lens 180 may, as a nonlimited example, include a light transmitting resin.

In some example embodiments, a second protective layer 185 may be formed on the micro lens 180. The second protective layer 185 may extend along a surface of the micro lens 180. The second protective layer 185 may, for example, include an inorganic oxide layer. The second protective layer 185 may, as a nonlimited example, include at least one of a silicon oxide, a titanium oxide, a zirconium oxide, a hafnium oxide, or any combination thereof. In some example embodiments, the second protective layer 185 may, for example, include a low temperature oxide (LTO).

The second protective layer 185 may protect the micro lens 180 from the outside (e.g., an exterior of the image sensor). For example, as the second protective layer 185 includes an inorganic oxide layer, it may protect the micro lens 180 including an organic material. Further, the second protective layer 185 may increase light condensing performance of the micro lens 180. For example, the second protective layer 185 may fill the space among the micro lenses 180 to thus reduce reactions such as reflection, refraction, or scattering of incident light reaching the space among the micro lenses 180.

In some example embodiments, the image sensor may further include a first connection structure 360. The first connection structure 360 may be formed in the light blocking region OB. The first connection structure 360 may be disposed in the light blocking region OB and may block the light input to the light blocking region OB. The first connection structure 360 may be formed on the surface insulation layer 150 of the light blocking region OB. The first connection structure 360 may contact the pixel separating pattern 120A.

A third trench t3 for exposing the pixel separating pattern 120A may be formed in the upper substrate 110B and the surface insulation layer 150 of the light blocking region OB. The first connection structure 360 may be formed in the third trench t3 and may contact the pixel separating pattern 120A in the light blocking region OB. The first connection structure 360 360 may extend along a profile of the sidewall and the bottom side of the third trench t3.

The first connection structure 360 may be electrically connected to the pixel separating pattern 120A. For example, the first connection structure 360 may be connected to the conductive layer of the pixel separating pattern 120A. The first connection structure may, as a nonlimited example, include a titanium (Ti) film, a titanium nitride (TiN) film, and a tungsten (W) film that are sequentially stacked.

In some example embodiments, a first pad pattern 365 may be formed on the first connection structure 360. The first pad pattern 365 is made of a metallic material for blocking light around the pixel array, and it may fill the second trench t2 remaining after filling the first connection structure 360. A first voltage may be applied to the pixel separating pattern 120A through the first pad pattern 365. For example, a negative voltage may be applied to the conductive layer through the first pad pattern 365 and first connection structure 360 including a conducting material, and hence, the charges generated by the reaction such as the ESD may be discharged to the first pad pattern 365 through the pixel separating pattern 120A, and the ESD bruise defects may be prevented.

The first pad pattern 365 may, as a nonlimited example, include at least one of tungsten (W), copper (Cu), aluminum (Al), gold (Au), silver (Ag), or any alloys thereof.

In some example embodiments, a third trench t3 may be formed in the upper substrate 110B of the light blocking region OB. The third trench t3 may expose a portion of the first wire pattern 145 of the first substrate structure 100. For example, the third trench t3 may represent a through silicon via.

The third trench t3 may expose a portion of a second wire pattern 242 and a third wire pattern 243 of the second substrate structure 200. The first connection structure 360 may be formed in the third trench t3 and may connect the second wire pattern 242 and the third wire pattern 243. The first connection structure 360 may extend along a sidewall and a bottom side of the third trench t3.

In some example embodiments, a first filling insulation layer 370 may be formed on the first connection structure 360. The first filling insulation layer 370 may, as a nonlimited example, include at least one of a silicon oxide, an aluminum oxide, a tantalum oxide, or any combination thereof.

In some example embodiments, a first capping pattern 375 may be formed on the first filling insulation layer 370. The first capping pattern 375 may include a silicon-based insulating material such as a silicon nitride, a silicon oxide, and a silicon oxynitride, and a high dielectric material such as a hafnium oxide and an aluminum oxide. The first capping pattern 375 may include the same material as the capping film 120C, but is not limited thereto.

In some example embodiments, a second color filter 170C may be formed on the first connection structure 360. The second color filter 170C may cover a portion of the first protective layer 165 of the light blocking region OB. The second color filter 170C may, as a nonlimited example, include a blue color filter.

In some example embodiments, a third protective layer 380 may be formed on the second color filter 170C. For example, the third protective layer 380 may cover a portion of the first protective layer 165 in the light blocking region OB. In some example embodiments, the second protective layer 185 may extend along a surface of the third protective layer 380. The third protective layer 380 may include a light transmitting resin as a nonlimited example. In some example embodiments, the third protective layer 380 may include the same material as the micro lens 180.

The third connection structure 457 may be formed in the pad region PAD. The second connection structure 450 may be formed on the surface insulation layer 150 of the pad region PAD. In some example embodiments, a fifth trench t5 may be formed in the first substrate structure 100 of the pad region PAD. The second connection structure 450 may be formed on a sidewall and a bottom side of the fifth trench t5.

A sixth trench t6 for exposing the second wire pattern 242 may be formed in the second substrate structure 200 of the pad region PAD. The third connection structure 457 may be formed on the sidewall and the bottom side of the sixth trench t6.

The third connection structure 457 may be formed in the sixth trench t6 and may contact part of the second wire pattern 242. The third connection structure 457 may electrically connect part of the second wire pattern 242 and the second pad pattern 455. The third connection structure 457 may, for example, be a sequential stack of a titanium (Ti) film, a titanium nitride (TiN) film, and a tungsten (W) film.

A second pad pattern 455 may be formed on the second connection structure 450. The second pad pattern 455 may fill the fifth trench t5 remaining after filling the third connection structure 457. The second pad pattern 455 may, as a nonlimited example, include at least one of tungsten (W), copper (Cu), aluminum (Al), gold (Au), silver (Ag), or any alloys thereof.

In some example embodiments, part of the second pad pattern 455 may be exposed. An exposure opening for exposing the second pad pattern 455 may be formed. Hence, the second pad pattern 455 may be configured to be connected to an external device and transmit/receive electrical signals between the image sensor according to some example embodiments and the external device.

The second filling insulation layer 470 may fill the sixth trench t6 remaining after filling the third connection structure 457. The second filling insulation layer 470 may, for example, include at least one of a silicon oxide, an aluminum oxide, a tantalum oxide, or any combination thereof, and is not limited thereto.

In some example embodiments, a second capping pattern 475 may be formed on the second filling insulation layer 470. The second capping pattern 475 may, for example, include a silicon-based insulating material such as a silicon nitride, a silicon oxide, and/or a silicon oxynitride, and a high dielectric material such as a hafnium oxide and/or an aluminum oxide. In detail, the second capping pattern 475 may, as a nonlimited example, include the same material as the capping film 120C.

In some example embodiments, a fourth protective layer 480 may be formed on the third connection structure 457 of the pad region PAD. For example, the fourth protective layer 480 may be formed to cover part of the first protective layer 165 in the pad region PAD. In some example embodiments, the second protective layer 185 may extend along the surface of the fourth protective layer 480. The fourth protective layer 480 may, for example, include a light transmitting resin, but is not limited thereto. In some example embodiments, the fourth protective layer 480 may include the same material as the micro lens 180.

In some example embodiments, the image sensor may further include a fifth connection structure (not shown). The fifth connection structure may be further formed in the light blocking region OB. The fifth connection structure may block the light formed and input into the light blocking region OB. The fifth connection structure may be formed on the surface insulation layer 150 of the light blocking region OB.

The fifth connection structure may contact at least part of the pixel separating pattern 120A. The fifth connection structure may contact at least part of the conductive layer of the pixel separating pattern 120A. The fifth connection structure may refer to the first connection structure 360 within the range of noncontradiction.

In some example embodiments, a seventh trench (not shown) for exposing the pixel separating pattern 120A may be formed in the upper substrate 110B and the surface insulation layer 150 of the light blocking region OB. The fifth connection structure may be formed in the seventh trench and may contact at least part of the pixel separating pattern 120A in the light blocking region OB. The fifth connection structure may extend along a profile of a sidewall and a bottom side of the seventh trench.

The fifth connection structure may be electrically connected to the pixel separating pattern 120A. In detail, the fifth connection structure may, as a nonlimited example, include a titanium (Ti) film, a titanium nitride (TiN) film, and a tungsten (W) film that are sequentially stacked.

In some example embodiments, an additional pad pattern (not shown) may be formed on the fifth connection structure. The additional pad pattern may fill the seventh trench remaining after filling the fifth connection structure. A voltage may be applied to the pixel separating pattern 120A through the additional pad pattern and the fifth connection structure including a conducting material. For example, the voltage may be a well bias voltage.

The additional pad pattern may include at least one of tungsten (W), copper (Cu), aluminum (Al), gold (Au), silver (Ag), or any alloys thereof as a nonlimited example.

Figure 7A:
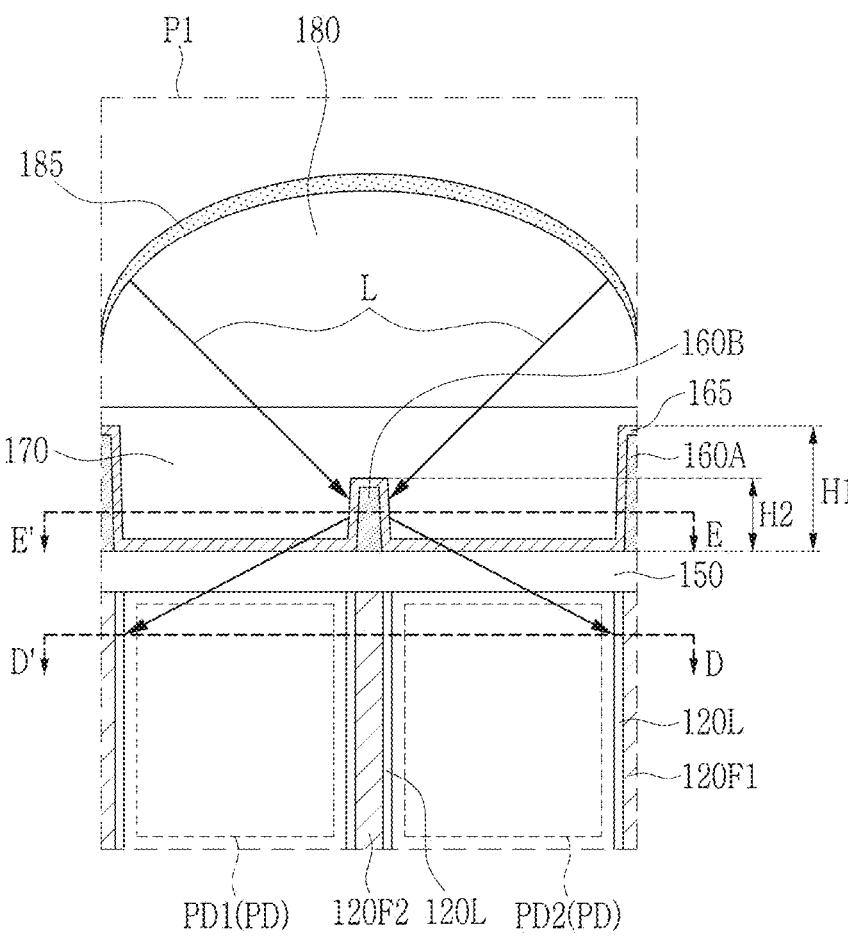
FIG. 7A and FIG. 7B show an enlarged region P1 of FIG. 6 according to some example embodiments.
Figure 7B:
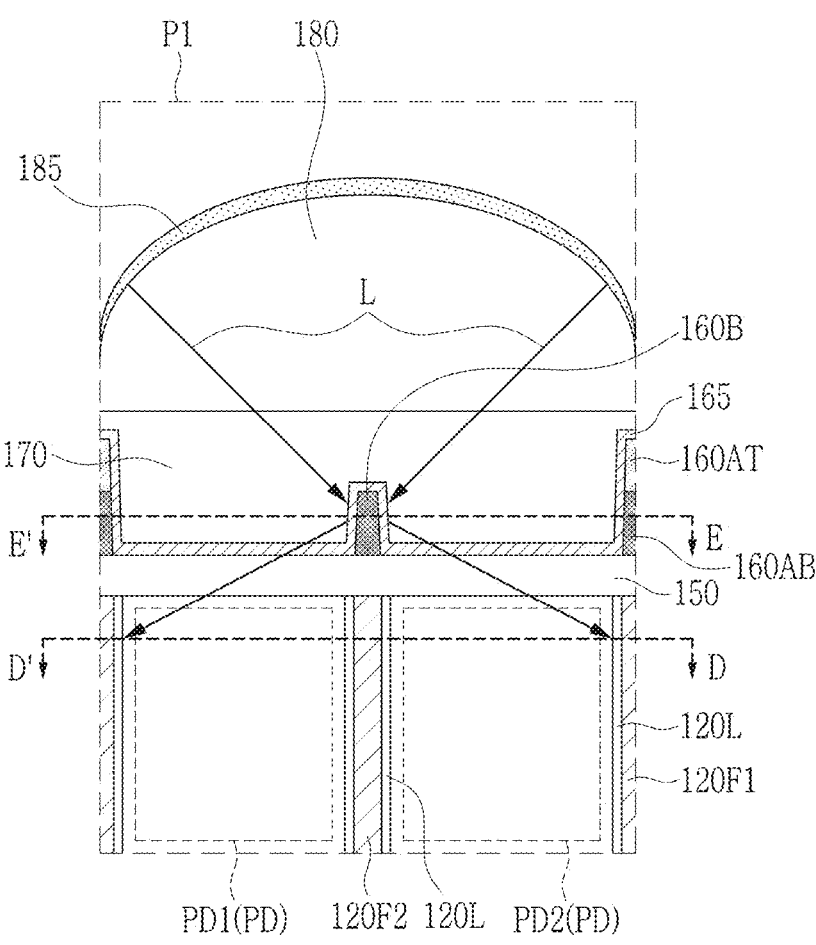

FIG. 7A and FIG. 7B show an enlarged region P1 of FIG. 6 according to some example embodiments.

Referring to FIG. 7A, the image sensor according to some example embodiments may include a first grid pattern 160A disposed on the pixel separating pattern 120A and a second grid pattern 160B disposed on the first separating pattern 120B and having lower height than the first grid pattern 160A, where a height of an element may refer to a thickness of an element in the third direction D3 which may extend perpendicular to an in-plane direction of the first substrate structure 100 (e.g., perpendicular to an upper surface and/or a bottom surface of the first substrate structure 100). In detail, a height H1 of the first grid pattern may be different from a height H2 of the second grid pattern.

In some example embodiments, the height H1 of the first grid pattern (also referred to herein as a first height) may be greater than the height H2 of the second grid pattern (also referred to herein as a second height). In detail, the height H2 of the second grid pattern may satisfy the range of $\frac{1}{10}$ to $\frac{1}{4}$ of the height H1 of the first grid pattern. In detail, the range may satisfy $\frac{1}{8}$ to $\frac{1}{5}$. The height H2 of the second grid pattern satisfies the above-noted range of the height H1 of the first grid pattern so when light L is input according to a shift, the input light L may be controlled to be easily input to the photoelectric conversion layers PD1 and PD2.

When the height (e.g., the height H2 of the second grid pattern 160B) is greater than a highest value of the range (e.g., greater than $\frac{1}{4}$ of the height H1 of the first grid pattern 160A), the light L is caught by the second grid pattern 160B when it shifts so it is difficult to reflect light L to the photoelectric conversion layers PD1 and PD2. When the height is lower than a lowest value of the range (e.g., smaller than $\frac{1}{10}$ of the height H1 of the first grid pattern 160A), an effect of a light yield by the second grid pattern 160B may be weak.

In some example embodiments, the second grid pattern 160B may have a lower refractive index than the first color filter 170. As the first color filter 170 has the greater refractive index than the second grid pattern 160B, the light L input to the first color filter 170 may be refracted or reflected while passing through the second grid pattern 160B and may be easily input to the photoelectric conversion layers PD1 and PD2.

In some example embodiments, a ratio of the refractive index of the second grid pattern 160B to the refractive index of the first color filter 170 may satisfy the range of 0.40 to 0.95. In detail, the range may satisfy 0.43 to 0.90.

As the refractive index satisfies the range, the light L input to the first color filter 170 may be easily input to the photoelectric conversion layers PD1 and PD2 and the light yield may be increased. When it digresses from the range, the input light L may not be input to the photoelectric conversion layers PD1 and PD2 and may be reflected, or may be absorbed into the liner layer 120L in the pixel separating pattern 120A.

In some example embodiments, the refractive index of the first color filter 170 may satisfy the range of 1.7 to 2.5. In some example embodiments, the refractive index of the second grid pattern 160B may satisfy the range of 1.0 to 1.6. In detail, the range may satisfy 1.2 to 1.5.

As the first color filter 170 has the greater refractive index than the second grid pattern 160B as described above, incident light L propagating from the first color filter 170 to the second grid pattern as shown in FIGS. 7A-7B proceeds to a sparse medium from a dense medium, the refraction becomes greater than the incident angle, and a total reflection may be progressed (e.g., increased).

Referring to FIG. 7B, the first grid pattern 160A may include a lower first grid pattern 160AB and an upper first grid pattern 160AT disposed on the lower first grid pattern 160AB. In detail, the first grid pattern 160A may have a stack structure. The stack structure may be produced in a process for stacking the first grid pattern 160A and the second grid pattern 160B.

In some example embodiments, the lower first grid pattern 160AB and the second grid pattern 160B may have the same or different refractive indices. When the lower first grid pattern 160AB and the second grid pattern 160B are made of a material with the same refractive index, the first grid pattern 160A and the second grid pattern 160B may be easily formed in a process for manufacturing the image sensor, which is a merit. When the lower first grid pattern 160AB and the second grid pattern 160B are made of materials with different refractive indices, the refraction or reflection of the incident light may be controlled in accordance with the design and the light yield may be increased, which is a merit in that the performance of the image sensor may be improved as described herein based on the increase in the light yield (e.g., the amount of incident light absorbed and/or photoelectrically converted at the photoelectric conversion layers PD).

In some example embodiments, the lower first grid pattern 160AB and the second grid pattern 160B may have the same height (e.g., the same height in the third direction D3). As described, the lower first grid pattern 160AB and the second grid pattern 160B with the same height may be simultaneously formed by disposing the first grid pattern 160A as a stack structure, and the process may be simplified by forming the upper first grid pattern 160AT.

Figure 8A:
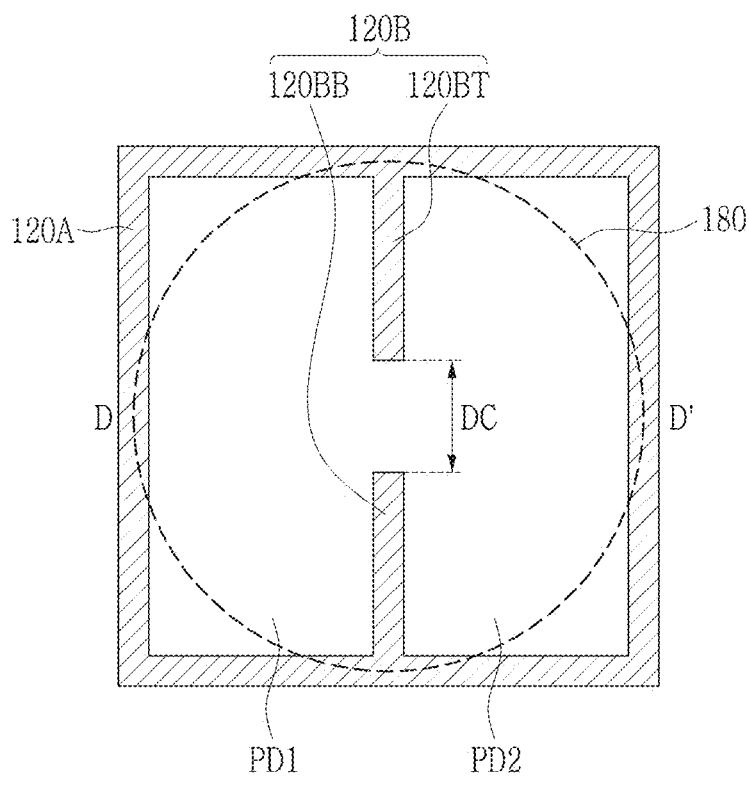
FIGS. 8A, 8B, and 8C show top plan views of a pixel separating pattern and a first separating pattern with respect to a cross-sectional view line D-D' in FIG. 7A according to some example embodiments of the present inventive concepts.
Figure 8B:
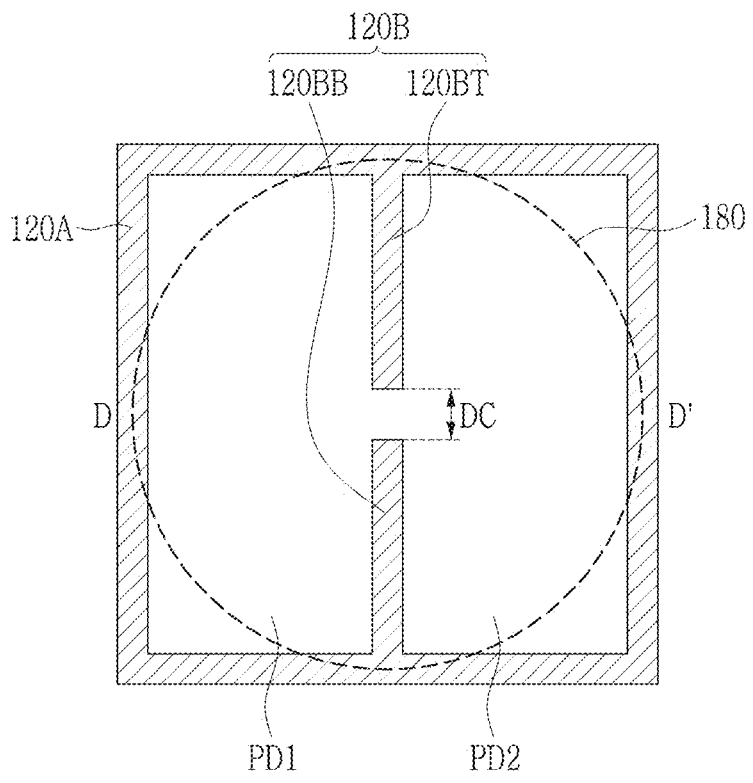
Figure 8C:
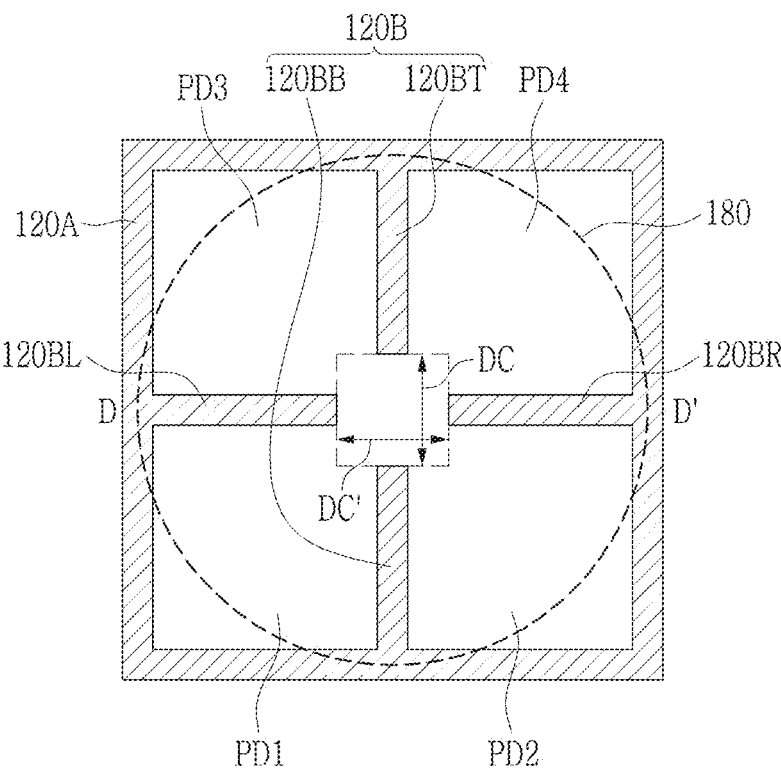
Figure 8C:
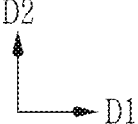

FIGS. 8A, 8B, and 8C show top plan views of a pixel separating pattern 120A and a first separating pattern 120B with respect to a cross-sectional view line D-D' in FIG. 7A according to some example embodiments of the present inventive concepts.

Referring to FIG. 8A and FIG. 8B, in some example embodiments, the first separating pattern 120B may include a first sub-separating pattern 120BT and a second sub-separating pattern 1201BB. In detail, the first sub-separating pattern 120BT may protrude from one side of the pixel separating pattern 120A, and the second sub-separating pattern 120BB may protrude from another side, facing the one side, of the pixel separating pattern 120A.

Widths of the first sub-separating pattern 120BT and the second sub-separating pattern 120BB may, for example, be 10 nm to 500 nm. FIG. 8A shows that the first sub-separating pattern 120BT and the second sub-separating pattern 120BB have the same width, which is an example, and the respective widths of the first sub-separating pattern 120BT and the second sub-separating pattern 120BB may be different from each other.

In some example embodiments, the first sub-separating pattern 120BT and the second sub-separating pattern 120BB may be spaced (e.g., spaced apart) from each other at a particular (or, alternatively, predetermined) interval DC. The particular (or, alternatively, predetermined) interval may, for example, be 100 nm to 1,000 nm.

As the first sub-separating pattern 120BT and the second sub-separating pattern 120BB are spaced at the particular (or, alternatively, predetermined) interval DC, an overflow pass may be formed between the photoelectric conversion layers PD1 and PD2 and the loss of optical signals may be reduced, minimized, or prevented, thereby improving functionality of the image sensor. As shown in FIG. 8A and FIG. 8B, the particular (or, alternatively, predetermined) interval DC between the first sub-separating pattern 120BT and the second sub-separating pattern 120BB may be appropriately designed and modified within the range of forming the overflow pass.

Referring to FIG. 8C, the image sensor may further include a third photoelectric conversion layer PD3 disposed near the first photoelectric conversion layer PD1 in the second direction D2 and a fourth photoelectric conversion layer PD4 disposed near the second photoelectric conversion layer PD2 in the second direction D2 in the unit pixel. In detail, FIG. 8B shows that one unit pixel includes first to fourth photoelectric conversion layers PD1, PD2, PD3, and PD4.

In some example embodiments, the third photoelectric conversion layer PD3 and the fourth photoelectric conversion layer PD4 may be at least partially defined by the first separating pattern 120B. In detail, the third photoelectric conversion layer PD3 may be separated from the first photoelectric conversion layer PD1 by the third sub-separating pattern 120BL of the first separating pattern 120B, and the fourth photoelectric conversion layer PD4 may be separated from the second photoelectric conversion layer PD2 by the fourth sub-separating pattern 120BR of the first separating pattern 120B.

In some example embodiments, the third sub-separating pattern 120BL and the fourth sub-separating pattern 120BR may be spaced from each other at a particular (or, alternatively, predetermined) interval DC'. A detailed description on the particular (or, alternatively, predetermined) interval DC' may refer to the content of the particular (or, alternatively, predetermined) interval DC described with the first sub-separating pattern 120BT and the second sub-separating pattern 120BB within the range of noncontradiction. FIG. 8C shows that the particular (or, alternatively, predetermined) interval DC of the first sub-separating pattern 120BT and the second sub-separating pattern 120BB is identical to the particular (or, alternatively, predetermined) interval DC' of the third sub-separating pattern 120BL and the fourth sub-separating pattern 1201BR, which is a nonlimited example, and the intervals may be different.

In some example embodiments, the image sensor may perform an auto focus (AF) function by using the first photoelectric conversion layer PD1 and the second photoelectric conversion layer PD2. The respective unit pixels may perform a phase detection auto focus (PDAF) function by using the divided one pair of photoelectric conversion layers PD1 and PD2.

The photoelectric conversion layers in the unit pixels may be divided and disposed in other directions. In detail, they may include a third photoelectric conversion layer PD3 disposed near (e.g., proximate to) the first photoelectric conversion layer PD1 in the second direction D2 and a fourth photoelectric conversion layer PD4 disposed near the second photoelectric conversion layer PD2 in the second direction D2 in the unit pixel. Through this, the image sensor may perform the auto focus function on the first direction D1 and the second direction D2.

FIGS. 9A, 9B, 9C, and 9D show top plan views of a first grid pattern 160A and a second grid pattern 160B with respect to a cross-sectional view line E-E' in FIG. 7A according to some example embodiments of the present inventive concepts.

Referring to FIGS. 9A, 9B, 9C, and 9D, the interval for disposing the second grid pattern 160B may be confirmed with reference to the particular (or, alternatively, predetermined) interval DC between the first sub-separating pattern 120BT and the second sub-separating pattern 1201BB.

Figure 9A:
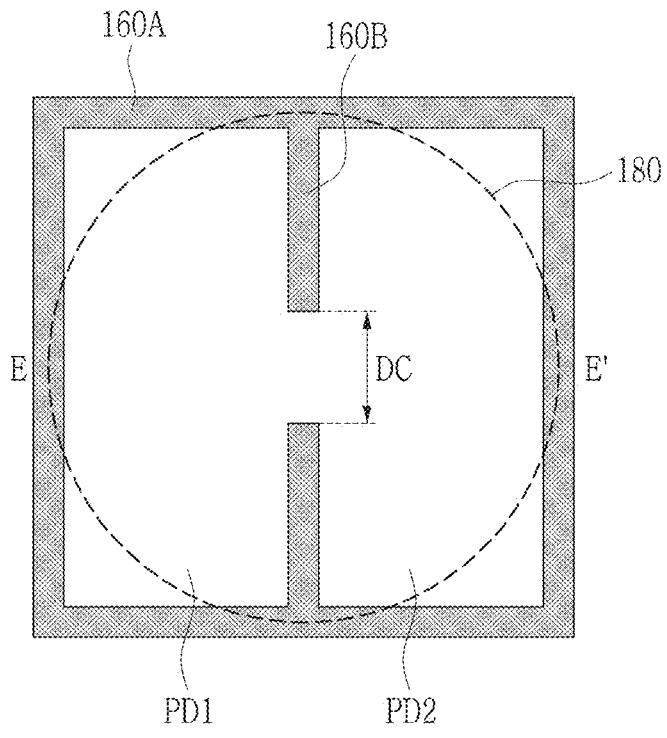
FIGS. 9A, 9B, 9C, and 9D show top plan views of a first grid pattern and a second grid pattern with respect to a cross-sectional view line E-E' in FIG. 7A according to some example embodiments of the present inventive concepts.

Referring to FIG. 9A, the first grid pattern 160A may be disposed on the pixel separating pattern 120A, and the second grid pattern 160B may be disposed on the first separating pattern 120B. As the first grid pattern 160A and the second grid pattern 160B are disposed on the pixel separating pattern 120A and the first separating pattern 120B, light (e.g., incident light) may be prevented from being absorbed into the liner layer 120L including polysilicon in the pixel separating pattern 120A and the first separating pattern 120B, or such absorption may be reduced or minimized, and the light may be prevented from being lost, or such loss may be reduced or minimized. Thus, the amount and/or proportion of such light that is absorbed and/or photoelectrically converted by the photoelectric conversion layers may be increased or maximized due to reduction, minimization, or prevention of the loss of such light to absorption into the pixel separating pattern 120A and/or the first separating pattern 120B may be reduced, minimized, or prevented. As a result, the image sensor may be configured to have improved light-detection and thus image generation performance, and also the image sensor may be configured to generate images having a greater quality due to the increased light-detection and thus image generation performance.

In some example embodiments, the second grid pattern 160B may have the same area as the first sub-separating pattern 120BT and the second sub-separating pattern 120BB in the first separating pattern 120B (e.g., where the area is in a horizontal plane extending in the first and second directions D1 and D2, in a horizontal plane extending in parallel with an in-plane direction of the first substrate structure 100, or the like). The second grid pattern 160B may have the same length and width (e.g., in the horizontal plane) as the first sub-separating pattern 120BT and the second sub-separating pattern 1201BB, and may cover the first sub-separating pattern 120BT and the second sub-separating pattern 120BB (e.g., overlap same in the third direction D3), thereby preventing the light input by the first color filter 170 from being absorbed into the liner layer 120L, or reducing or minimizing such absorption.

Figure 9B:
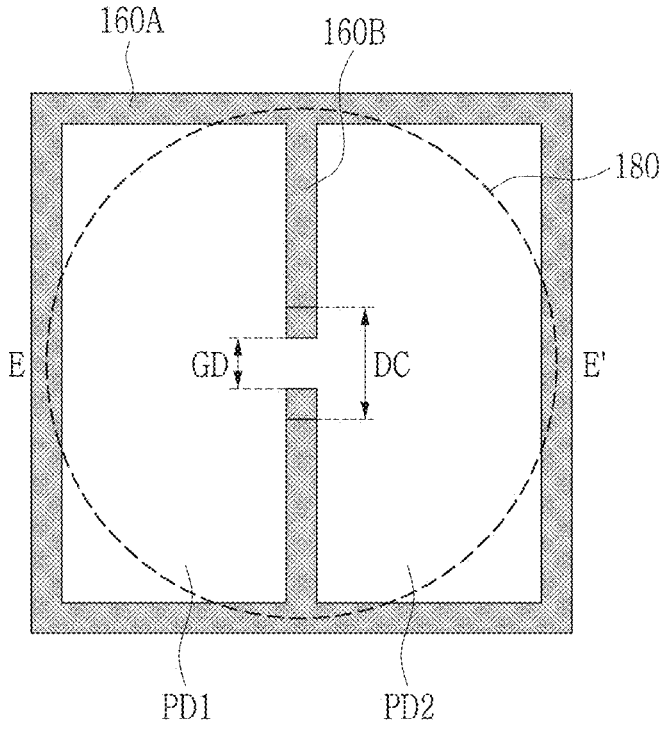

Referring to FIG. 9B, in some example embodiments, the second grid pattern 160B may have a greater area than the first sub-separating pattern 120BT and the second sub-separating pattern 120BB in the first separating pattern 120B (e.g., where the area is in a horizontal plane extending in the first and second directions D1 and D2, in a horizontal plane extending in parallel with an in-plane direction of the first substrate structure 100, or the like). In detail, the second grid pattern 160B may have a spaced interval GD of the second grid pattern that is narrower than the particular (or, alternatively, predetermined) interval DC between the first sub-separating pattern 120BT and the second sub-separating pattern 120BB. As the spaced interval GD of the second grid pattern is shorter than the particular (or, alternatively, pre-determined) interval DC between the first sub-separating pattern 120BT and the second sub-separating pattern 120BB, the light input by the first color filter 170 may be more efficiently prevented from being absorbed into the liner layer 120L. Thus, the amount and/or proportion of such light that is absorbed and/or photoelectrically converted by the photoelectric conversion layers may be increased or maximized due to reduction, minimization, or prevention of the loss of such light to absorption into the liner layer 120L may be reduced, minimized, or prevented. As a result, the image sensor may be configured to have improved light-detection and thus image generation performance, and also the image sensor may be configured to generate images having a greater quality due to the increased light-detection and thus image generation performance.

Figure 9C:
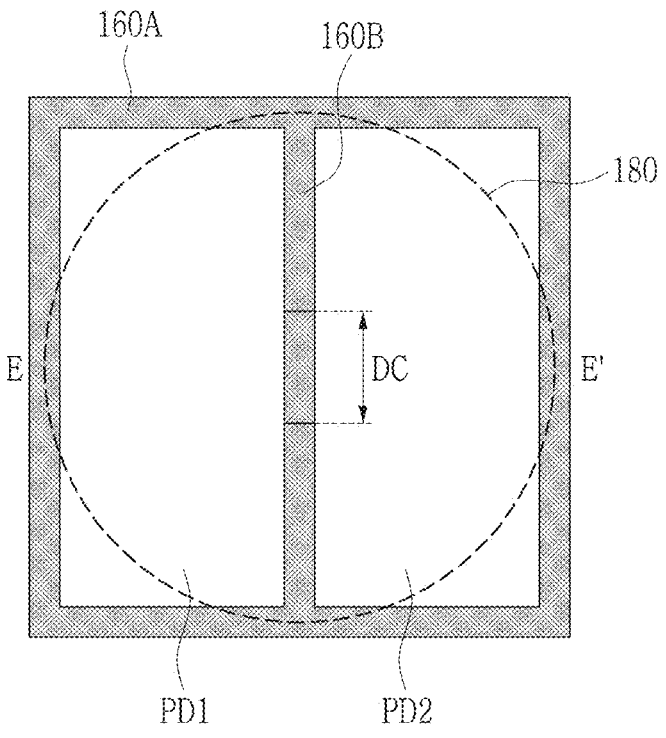

Referring to FIG. 9C, in some example embodiments, the second grid pattern 160B may completely cover (e.g., over-lap in the third direction D3) the particular (or, alternatively, predetermined) interval DC between the first sub-separating pattern 120BT and the second sub-separating pattern 120BB in the first separating pattern 120B. In detail, the second grid pattern 160B may seal the first sub-separating pattern 120BT and the second sub-separating pattern 120BB and may more efficiently prevent the light input by the first color filter 170 from being absorbed into the liner layer 120L. Thus, the amount and/or proportion of such light that is absorbed and/or photoelectrically converted by the photoelectric con-version layers may be increased or maximized due to reduction, minimization, or prevention of the loss of such light to absorption into the liner layer 120L may be reduced, minimized, or prevented. As a result, the image sensor may be configured to have improved light-detection and thus image generation performance, and also the image sensor may be configured to generate images having a greater quality due to the increased light-detection and thus image generation performance.

Figure 9D:
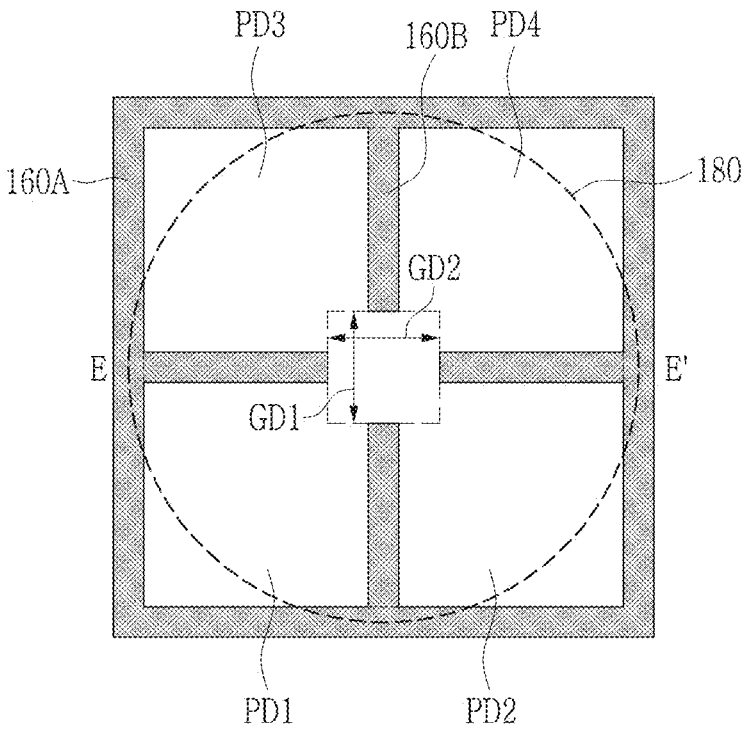

Referring to FIG. 9D, when the pixel separating pattern 120A and the first separating pattern 120B have four pho-toelectric conversion layers PD1, PD2, PD3, and PD4 as shown in FIG. 8B, they may have a second grid pattern 160B for covering the four photoelectric conversion layers PD1, PD2, PD3, and PD4.

FIGS. 9A, 9B, 9C, and 9D show that the width of the second grid pattern 160B has the same interval as the widths of the first sub-separating pattern 120BT and the second sub-separating pattern 120BB, which is a nonlimited example, and the width of the second grid pattern 160B may have an interval that is wider than the widths of the first sub-separating pattern 120BT and the second sub-separating pattern 120BB.

Figure 10:
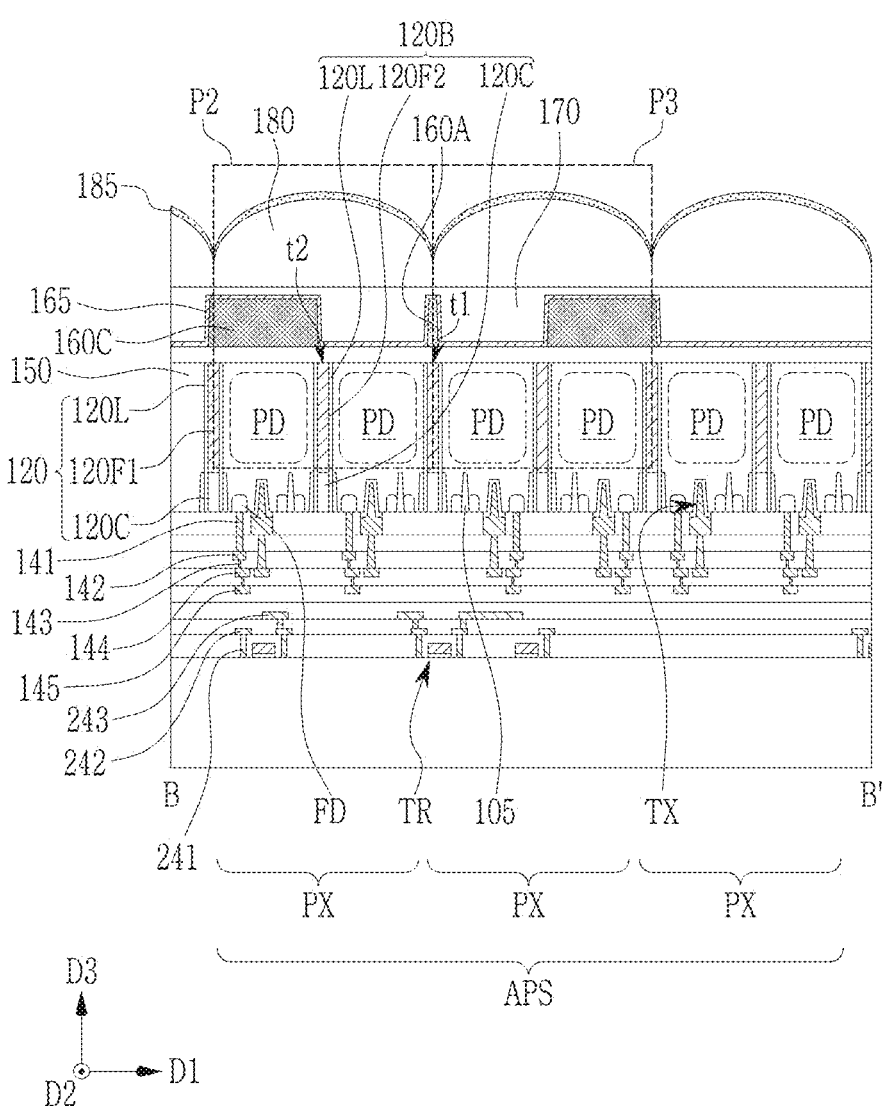
FIG. 10 shows a partial cross-sectional diagram of an image sensor with respect to a cross-sectional view line B-B' in FIG. 5 according to some example embodiments of the present inventive concepts.

FIG. 10 shows a partial cross-sectional diagram of an image sensor with respect to a cross-sectional view line B-B' in FIG. 5 according to some example embodiments of the present inventive concepts.

Referring to FIG. 10, the image sensor according to some example embodiments of the present inventive concepts may include a first substrate structure 100 including a first side 112a for receiving light and a second side 112b that is opposite the first side 112a, a pixel separating pattern 120A for defining adjacent unit pixels in the first substrate struc-ture 100, a first photoelectric conversion layer PD1 and a second photoelectric conversion layer PD2 arranged in the first direction D1 in the pixel separating pattern 120A, a first separating pattern 120B for defining the first photoelectric conversion layer PD1 and the second photoelectric conver-sion layer PD2 in the first substrate structure 100 between the first photoelectric conversion layer PD1 and the second photoelectric conversion layer PD2, and a third grid pattern 160C disposed on at least one of the first photoelectric conversion layer PD1 and the second photoelectric conver-sion layer PD2. Referring to FIG. 10, for the purposes of description, the unit pixel included in region P2 may be referred to as a unit pixel, and the unit pixel included in region P3 may be referred to interchangeably as an "addi-tional" unit pixel or an "other" unit pixel, and the respective separating patterns, photoelectric conversion layers, and the like of the unit pixel in region P3 may be interchangeably referred to as "additional" or "other" separating patterns, photoelectric conversion layers, and the like.

The third grid pattern 160C may be on (e.g., at least partially vertically overlap in the third direction D3) one photoelectric conversion layer of the first photoelectric conversion layer PD1 of the unit pixel in region P2 or the second photoelectric conversion layer PD2 of the unit pixel in region P2. The third grid pattern 160C may be on (e.g., at least partially vertically overlap in the third direction D3) one additional photoelectric conversion layer of the addi-tional first photoelectric conversion layer PD1 of the addi-tional unit pixel in region P3 or the additional second photoelectric conversion layer PD2 of the additional unit pixel in region P3. The third grid pattern 160C may be disposed on the first photoelectric conversion layer PD1 in the unit pixel region PX, and may be disposed on (e.g., overlap in the third direction D3) the second photoelectric conversion layer PD2 in the other ("additional") unit pixel region PX. In detail, the third grid pattern 160C may block (e.g., completely cover, also referred to herein as completely overlapping in the third direction D3 which is also referred to herein interchangeably as the vertical direction extending perpendicular to the in-plane direction of the first substrate structure 100) one of the first photoelectric conversion layer PD1 or the second photoelectric conversion layer PD2 of a given unit pixel to quickly confirm the optical signal and more quickly perform the auto focus function.

For example, the third grid pattern 160C may more quickly confirm the optical signal of the second photoelec-tric conversion layer PD2 from the light input to the second photoelectric conversion layer PD2 in the unit pixel region PX for blocking the first photoelectric conversion layer PD1, and it may more quickly confirm the optical signal of the first photoelectric conversion layer PD1 from the light input to the first photoelectric conversion layer PD1 in the other unit pixel region PX, thereby increasing an auto focus contrast in the image sensor.

FIG. 10 shows that the third grid pattern 160C blocks the first photoelectric conversion layer PD1 and the second photoelectric conversion layer PD2 in the adjacent unit pixel region PX, which does not limit the present inventive concepts, and it may block the first photoelectric conversion layer PD1 and the second photoelectric conversion layer PD2 in the spaced unit pixel region PX.

Figure 11A:
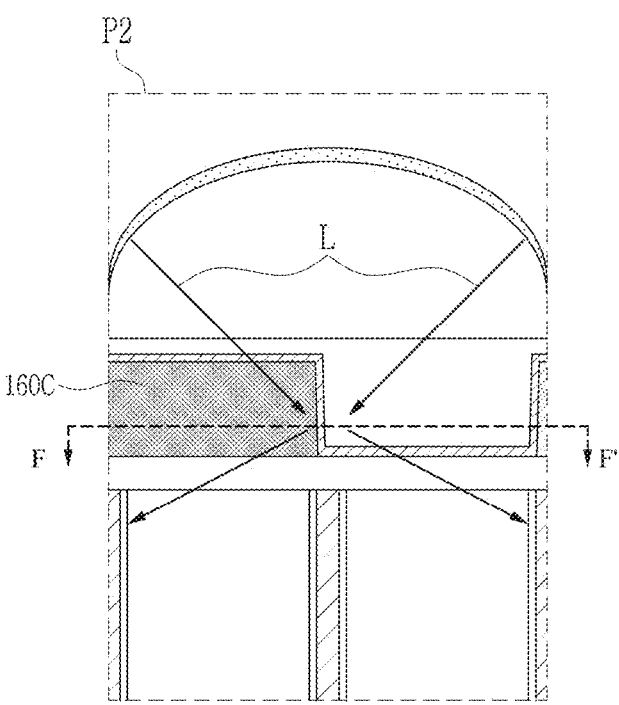
FIG. 11A and FIG. 11B show enlarged regions P2 and P3, respectively, of FIG. 10.
Figure 11B:
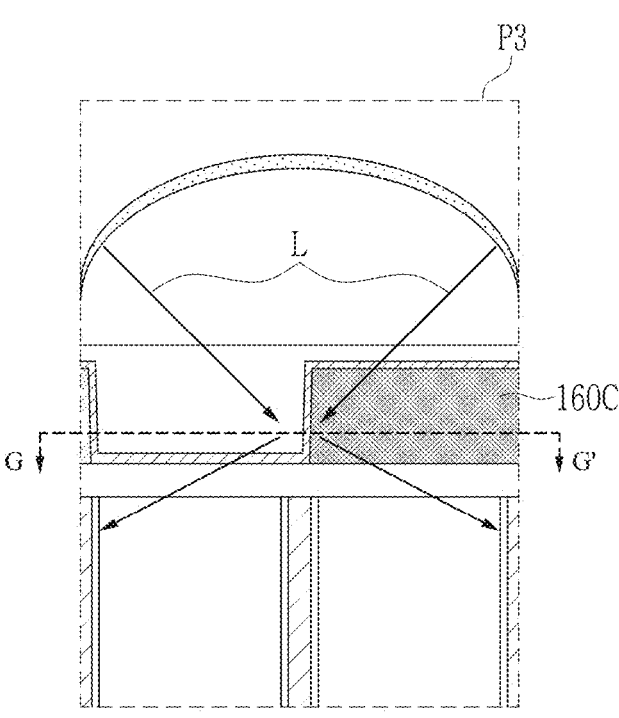

FIG. 11A and FIG. 11B show enlarged regions P2 and P3, respectively, of FIG. 10.

Referring to FIG. 11A and FIG. 11B, in some example embodiments, the third grid pattern 160C may completely cover the first photoelectric conversion layer PD1 or the second photoelectric conversion layer PD2. The third grid pattern 160C may cover the first photoelectric conversion layer PD1 in the unit pixel region PX, and the third grid pattern 160C may cover the second photoelectric conversion layer PD2 in the other unit pixel region PX, thereby quickly determining the signal of light input to the first photoelectric conversion layer PD1 or the second photoelectric conversion layer PD2 in the unit pixel region PX and increasing the auto focus contrast in the image sensor, thereby improving the image generating functionality of the image sensor.

Figure 12A:
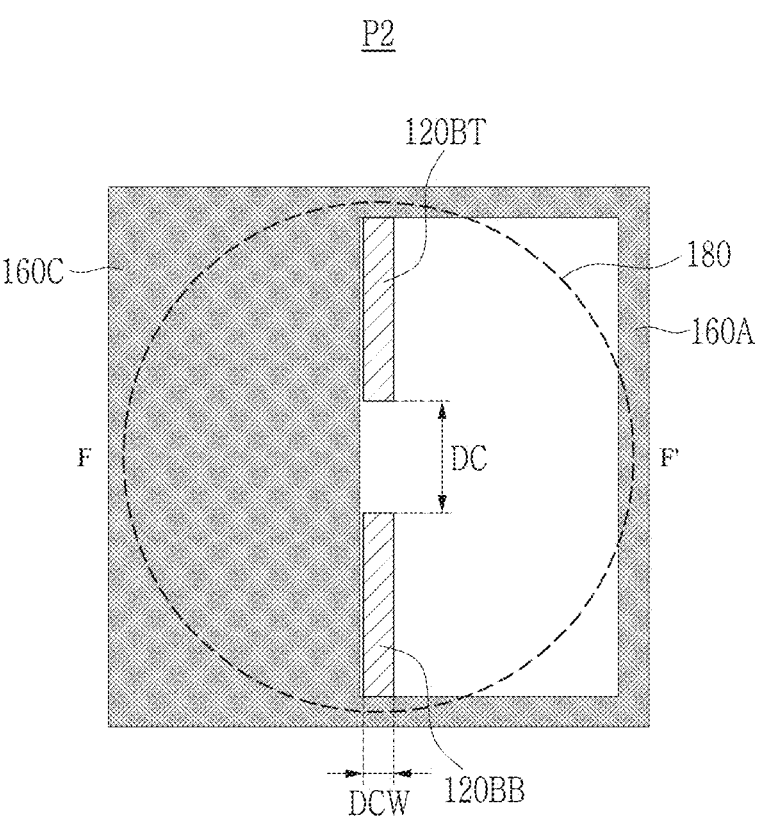
FIGS. 12A, 12B, 12C, 12D, 12E, and 12F show top plan views of a region P2 with respect to a cross-sectional view line F-F' in FIG. 11A or a region P3 with respect to a cross-sectional view line G-G' in FIG. 11B.
Figure 12B:
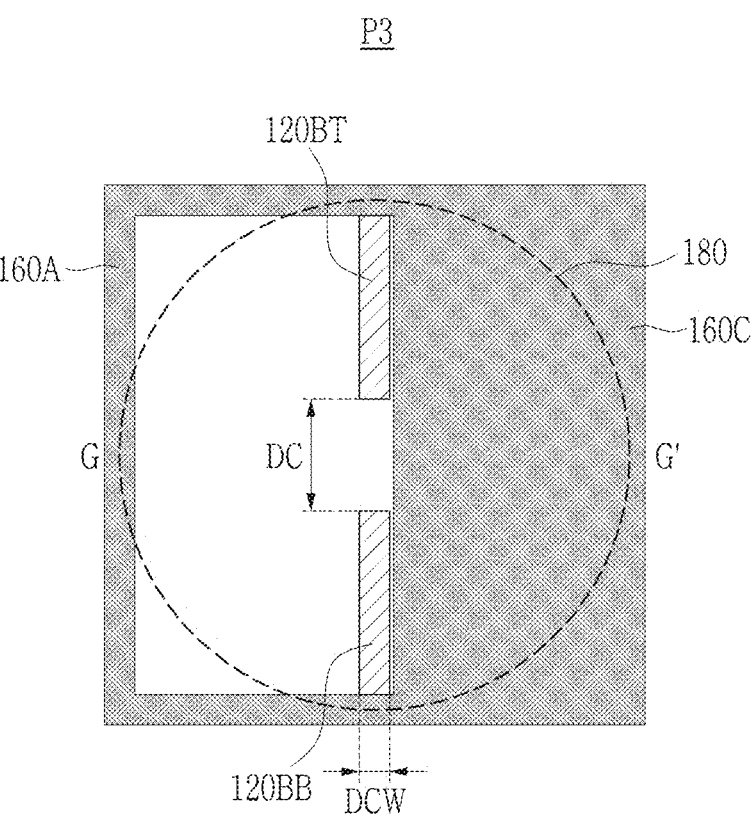
Figure 12C:
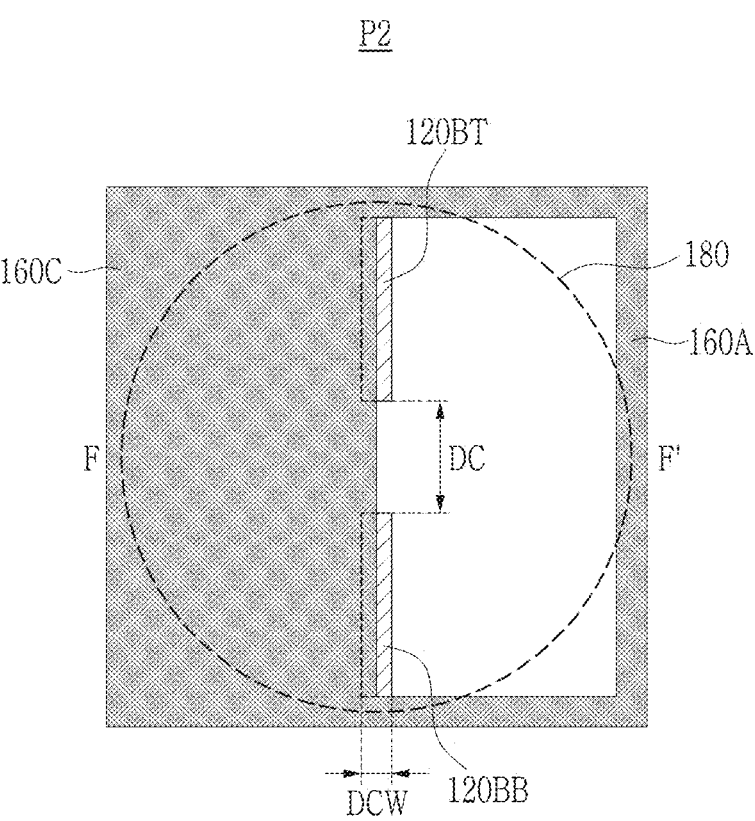
Figure 12D:
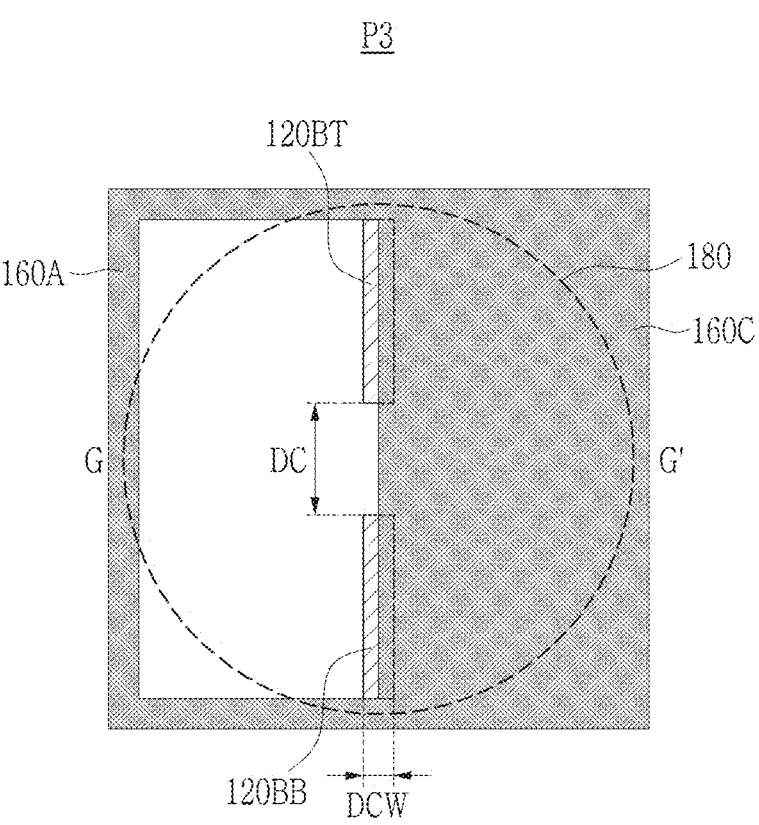
Figure 12E:
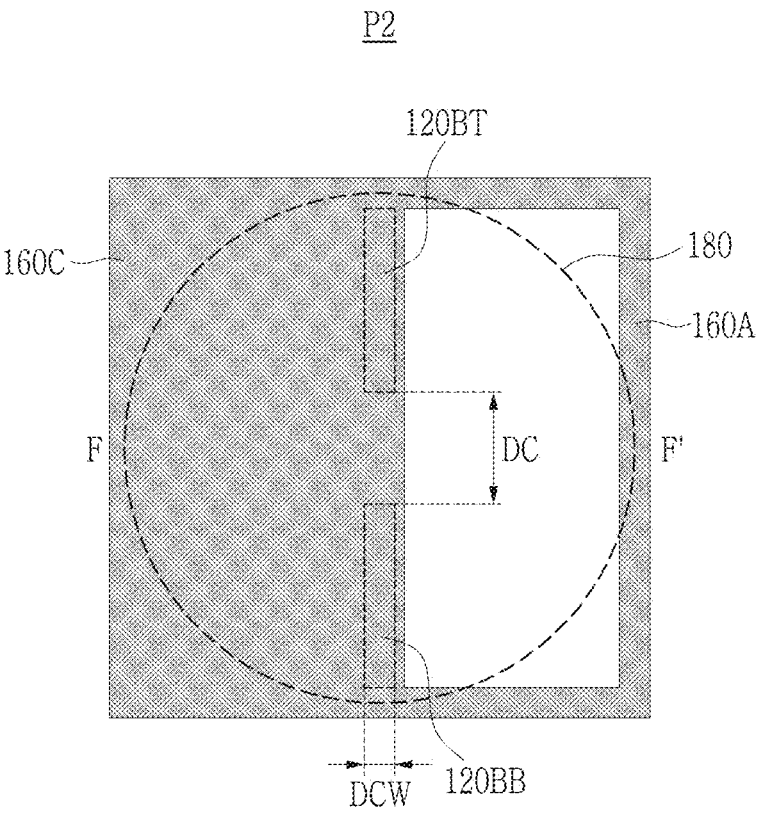

FIGS. 12A, 12B, 12C, 12D, 12E, and 12F show top plan views of a region P2 with respect to a cross-sectional view line F-F' in FIG. 11A or a region P3 with respect to a cross-sectional view line G-G' in FIG. 11B. In particular, FIGS. 12A, 12C, and 12E show top plan views of a region P2 with respect to a cross-sectional view line F-F' in FIG. 11A, and FIGS. 12B, 12D, and 12F show top plan views of a region P3 with respect to a cross-sectional view line G-G' in FIG. 11B.

Referring to FIG. 12A and FIG. 12B, the third grid pattern 160C may be disposed on the first photoelectric conversion layer PD1 or the second photoelectric conversion layer PD2 and may not be disposed on (e.g., may completely expose in the third direction D3 and/or may not overlap in the third direction D3) the first sub-separating pattern 120BT and the second sub-separating pattern 120BB.

Referring to FIG. 12C and FIG. 12D, the third grid pattern 160C may be disposed on the first photoelectric conversion layer PD1 or the second photoelectric conversion layer PD2, and may be disposed on (e.g., may overlap in the third direction D3) at least a particular (or, alternatively, predetermined) region of the first sub-separating pattern 120BT and the second sub-separating pattern 120BB. In detail, the third grid pattern 160C may cover at least a particular (or, alternatively, predetermined) region of the width DCW of the first sub-separating pattern 120BT and the second sub-separating pattern 1201BB.

Figure 12F:
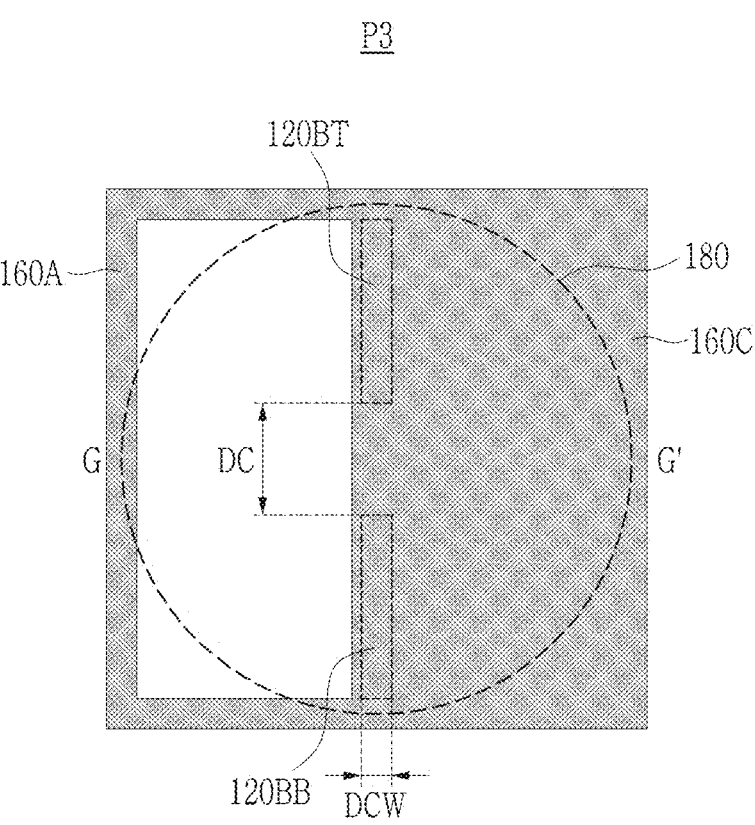

Referring to FIG. 12E and FIG. 12F, the third grid pattern 160C may be disposed on the first photoelectric conversion layer PD1 or the second photoelectric conversion layer PD2, and may be disposed to completely cover the first sub-separating pattern 120BT and the second sub-separating pattern 120BB.

Referring to FIG. 12A to FIG. 12F, as the third grid pattern 160C completely covers the first sub-separating pattern 120BT and the second sub-separating pattern 120BB, the incident light may be prevented from being absorbed into the liner layer 120L of the first sub-separating pattern 120BT and the second sub-separating pattern 120BB.

Figure 13:
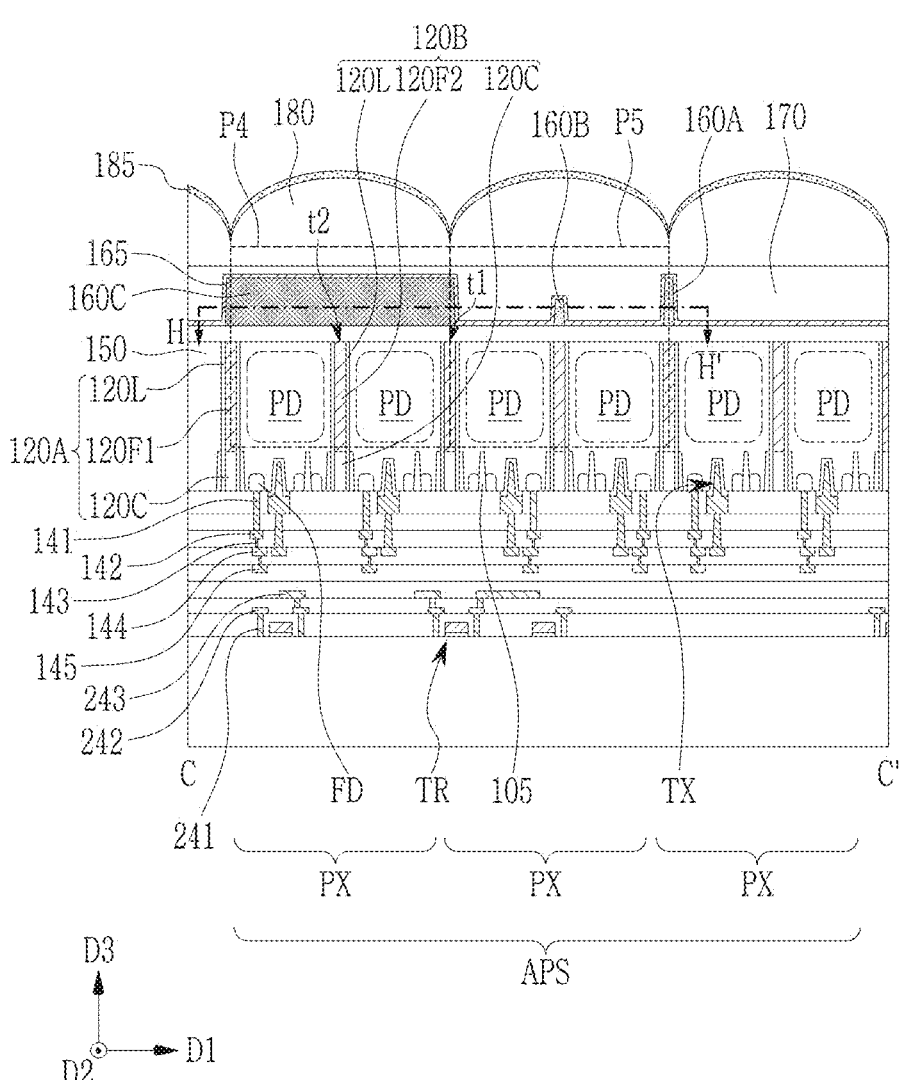
FIG. 13 shows a partial cross-sectional diagram of an image sensor with respect to a cross-sectional view line C-C' in FIG. 5 according to some example embodiments of the present inventive concepts.

FIG. 13 shows a partial cross-sectional diagram of an image sensor with respect to a cross-sectional view line C-C' in FIG. 5 according to some example embodiments of the present inventive concepts.

Referring to FIG. 13, in some example embodiments, the third grid pattern 160C may simultaneously block part of the first photoelectric conversion layer PD1 and the second photoelectric conversion layer PD2.

Figure 14A:
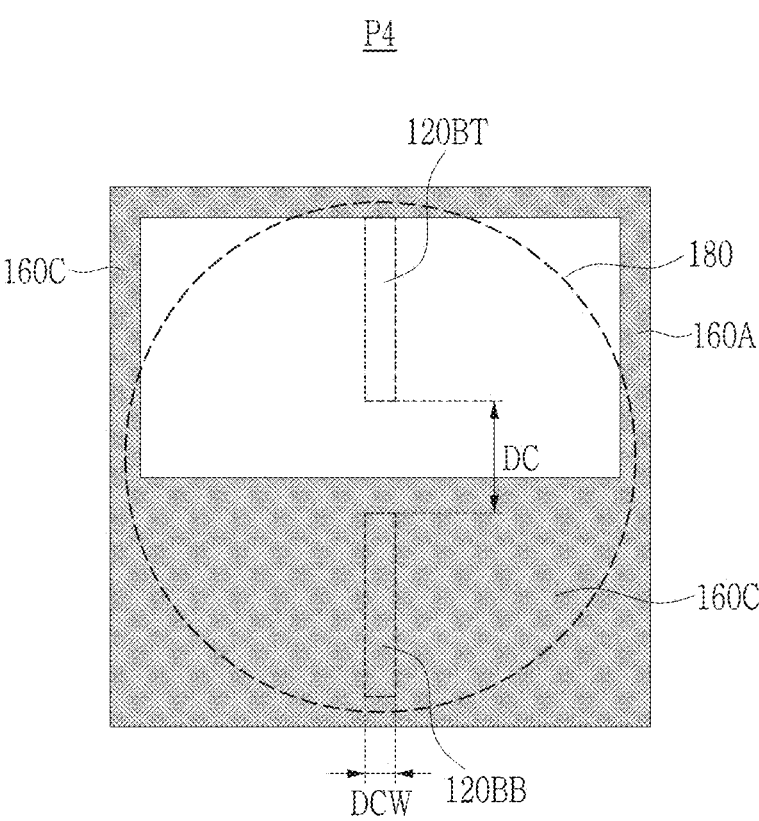
FIG. 14A and FIG. 14B show top plan views of a region P4 and a region P5 with respect to a cross-sectional view line H-H' in FIG. 13.
Figure 14B:
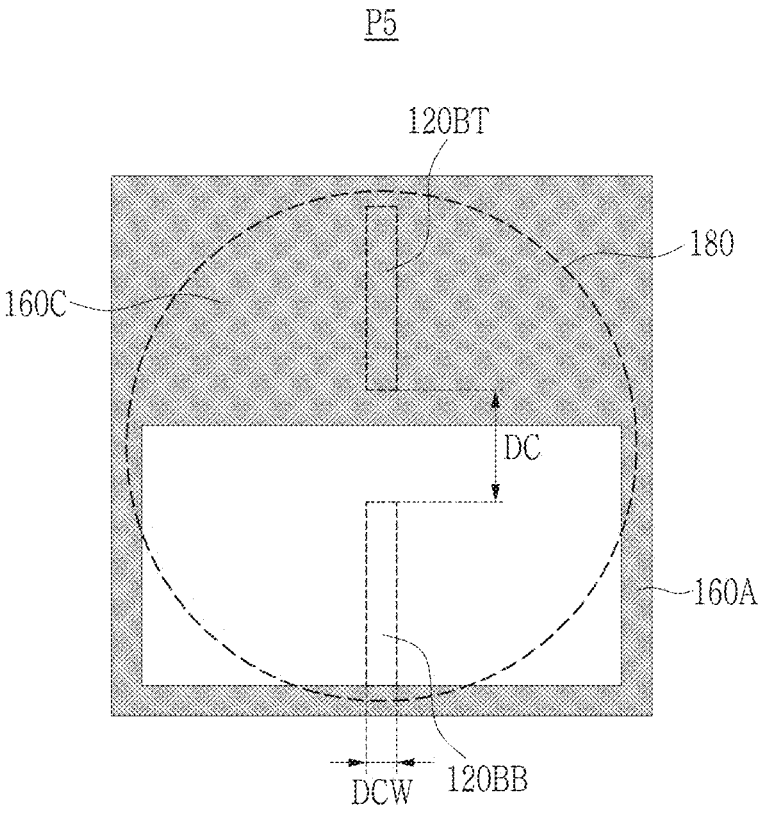

FIG. 14A and FIG. 14B show top plan views of a region P4 and a region P5 with respect to a cross-sectional view line H-H' in FIG. 13.

Referring to FIG. 14A, the third grid pattern 160C may block part of the first photoelectric conversion layer PD1 and the second photoelectric conversion layer PD2 and may block the second sub-separating pattern 120BB. Referring to FIG. 14B, the third grid pattern 160C may block part of the first photoelectric conversion layer PD1 and the second photoelectric conversion layer PD2 and may block the first sub-separating pattern 120BT.

In detail, as the light blocked unit pixels coexist in the part of the first photoelectric conversion layer PD1 and the second photoelectric conversion layer PD2, for example, the lower region or the upper region in the unit pixel region PX, the third grid pattern 160C may more quickly confirm the optical signal on the lower region and the upper region of the unit pixel region PXs and may more quickly perform the auto focus, thereby improving the image generating functionality of the image sensor based on configuring the image sensor to provide improved auto focus functionality.

FIG. 14A and FIG. 14B show that the third grid pattern 160C completely covers (e.g., overlaps in the third direction D3) the first sub-separating pattern 120BT and the second sub-separating pattern 120BB, which is a nonlimited example, and the third grid pattern 160C having the same length as the first sub-separating pattern 120BT and the second sub-separating pattern 120BB may be disposed.

The image sensor according to some example embodiments of the present inventive concepts may include a first substrate structure 100 including a first side 112a for receiving light and a second side 112b that is opposite the first side 112a, a pixel separating pattern 120A for defining an adjacent unit pixel in the first substrate structure 100, a first photoelectric conversion layer PD1 and a second photoelectric conversion layer PD2 arranged in the first direction in the pixel separating pattern 120A, a first separating pattern 120B for defining the first photoelectric conversion layer PD1 and the second photoelectric conversion layer PD2 in the first substrate structure 100 between the first photoelectric conversion layer PD1 and the second photoelectric conversion layer PD2, a first grid pattern 160A disposed on the pixel separating pattern 120A, and second grid pattern 160B disposed on the first separating pattern 120B and having a lower height than the first grid pattern 160A, and another unit pixel spaced from the unit pixel may include a first photoelectric conversion layer PD1 and a second photoelectric conversion layer PD2 arranged in the first direction in the pixel separating pattern 120A, a first separating pattern 120B for separating the first photoelectric conversion layer PD1 and the second photoelectric conversion layer PD2 in the first substrate structure 100 between the first photoelectric conversion layer PD1 and the second photoelectric conversion layer PD2, and a third grid pattern 160C disposed on at least one of the first photoelectric conversion layer PD1 and the second photoelectric conversion layer PD2.

In some example embodiments, the second grid pattern 160B may be disposed between the first separating pattern 120B and the third grid pattern 160C. In detail, the third grid pattern 160C may cover at least a portion of the second grid pattern 160B. For example, the third grid pattern 160C may cover part of the second grid pattern 160B, and may cover the entire second grid pattern 160B.

In detail, one unit pixel in the image sensor includes a second grid pattern 160B, and another unit pixel disposed near or spaced from the unit pixel has a structure in which at least part of the first photoelectric conversion layer PD1 and the second photoelectric conversion layer PD2 is blocked from light so the auto focus may be more quickly performed from the unit pixels having the light blocked structure, photosensitivity may be simultaneously increased from the unit pixels including the second grid pattern 160B, and a high auto focus separation ratio may be obtained.

FIGS. 15A, 15B, 15C, 15D, 15E, 15F, 15G, and 15H show a method for manufacturing an image sensor according to some example embodiments of the present inventive concepts.

Figure 15A:
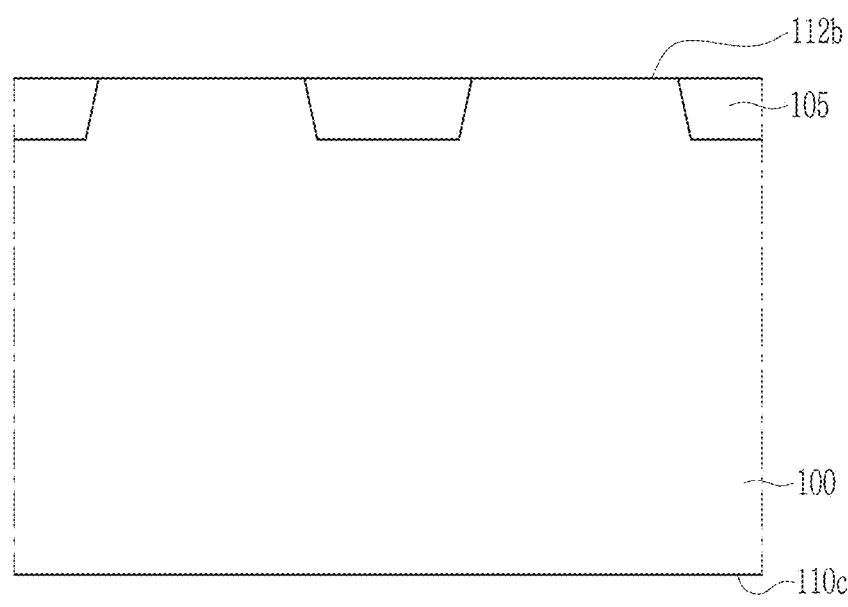
FIGS. 15A, 15B, 15C, 15D, 15E, 15F, 15G, and 15H show a method for manufacturing an image sensor according to some example embodiments of the present inventive concepts.

Referring to FIG. 15A, a first substrate structure 100 including a second side 112b and a third side 110c facing each other may be provided. A trench isolation pattern 105 may be formed in the first substrate structure 100. A trench of which a portion is recessed from the second side 112b of the first substrate structure 100 may be formed in the first substrate structure 100. The trench isolation pattern 105 may be formed in the trench. The trench isolation pattern 105 may define active regions.

Figure 15B:
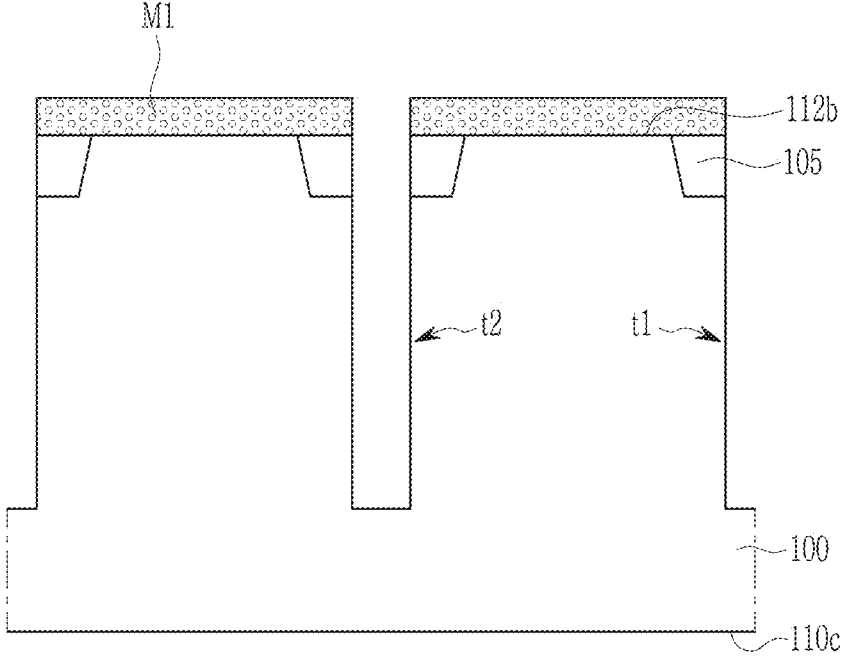

Referring to FIG. 15B, a first mask layer M1 may be formed on the second side 112b of the first substrate structure 100. The first mask layer M1 may have an opening for limiting positions of the first trench t1 and the second trench t2. The first mask layer M1 may be formed of at least one of a photoresist layer, an amorphous carbon layer (ACL), a spin on hardmask (SOH), spin on carbon (SOC), a silicon oxide layer, or a silicon nitride. The first trench t1 may be formed by using the first mask layer M1 as an etching mask. The first trench t1 may penetrate the trench isolation pattern 105.

Figure 15C:
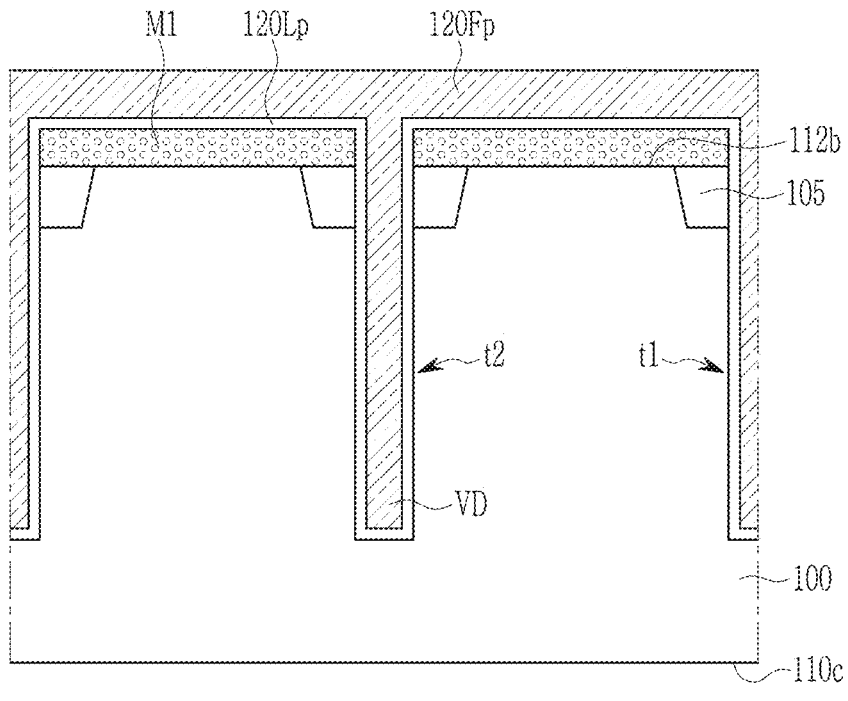

Referring to FIG. 15C, a pre-liner film 120Lp may be formed along sidewalls and bottom sides of the first trench t1 and the second trench t2. A pre-pixel separating filling film 120Fp may be formed on the pre-liner film 120Lp.

The pre-liner film 120Lp may extend along the upper side of the first mask layer M1. The pre-liner film 120Lp may include an insulating material. The pre-liner film 120Lp may, as a nonlimited example, include at least one of a silicon oxide, an aluminum oxide, a tantalum oxide, or any combination thereof.

The pre-pixel separating filling film 120Fp may include an insulating material or a conducting material. The insulating material may include a silicon-based insulating material such as a silicon nitride, a silicon oxide, or a silicon oxynitride, and a high-dielectric material such as a hafnium oxide, an aluminum oxide, or a tantalum oxide. The conducting material may, for example, include silicon to which polysilicon (Poly Si), arsenide (As), phosphorus (P), boron (B), or carbon (C) is doped, and is not limited thereto.

To form a front deep trench isolation (FDTI), the pre-pixel separating filling film 120Fp may be formed deep in the direction of the third side 110c on the second side 112a, and the pre-pixel separating filling film 120Fp may be filled in the first trench t1 and the second trench t2, and may form the first separating pattern 120B and the pixel separating pattern 120A.

Figure 15D:
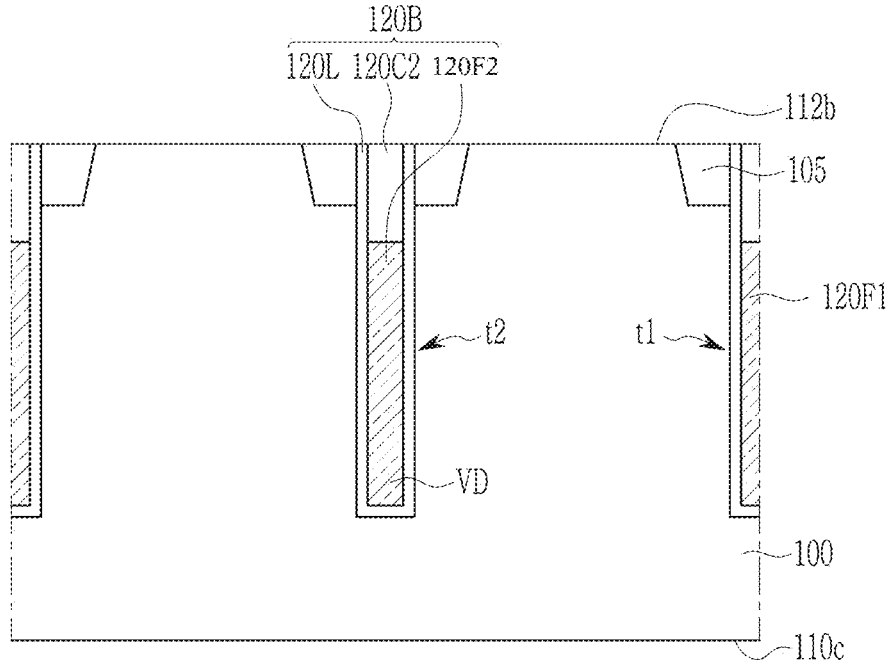

Referring to FIG. 15D, the pixel separating pattern 120A and the first separating pattern 120B may be formed. The pixel separating pattern 120A may include a liner layer 120L, a first pixel separating filling film 120F1, and a capping film 120C. The first separating pattern 120B may include a liner layer 120L, a first separating filling film 120F2, and a capping film 120C.

The first pixel separating filling film 120F1 and the first separating filling film 120F2 may be formed by etching part of the pre-pixel separating filling film 120Fp. The first pixel separating filling film 120F1 and the first separating filling film 120F2 may be formed by an etch back process. A pre-capping film (not shown) may be formed on the first pixel separating filling film 120F1 and the first separating filling film 120F2.

The liner layer 120L and the capping film 120C may be formed by removing part of the pre-capping film, part of the pre-liner film 120Lp, and the first mask layer M1. The first side 112b of the first substrate structure 100 may be exposed by removing part of the pre-capping film, part of the pre-liner film 120Lp, and the first mask layer M1.

Figure 15E:
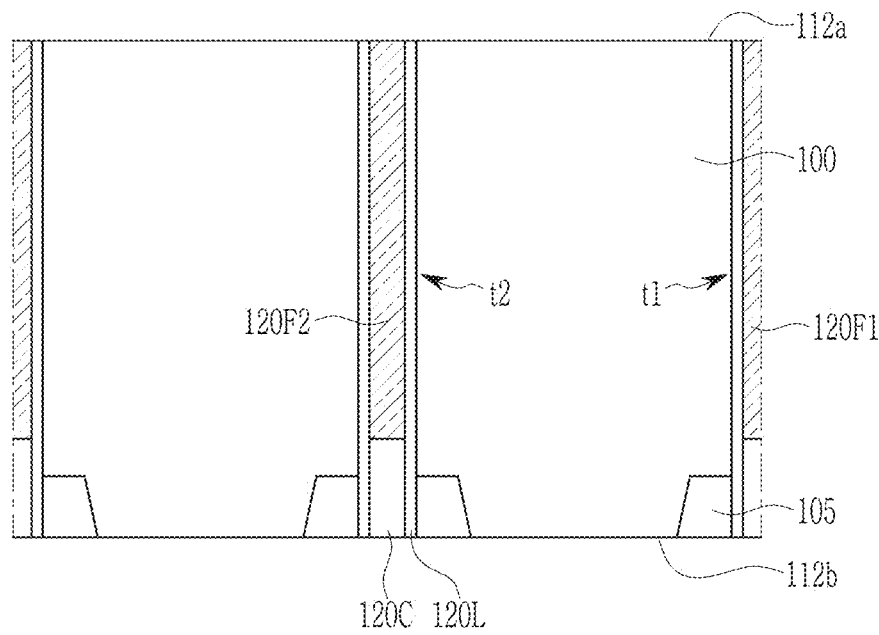

Referring to FIG. 15E, the first side 112a may be formed by polishing the third side 110c that is a rear side of the first substrate structure 100. To polish the third side 110c, as a nonlimited example, various types of polishing methods such as a chemical mechanical polishing (CMP) may be used. According to the polishing method, the polishing may be performed so that part of the first pixel separating filling film 120F1 and the first separating filling film 120F2 may be provided on the same side of the first side 112a.

The first side 112a of the first substrate structure 100 may be rinsed. The rinsing of the first side 112a of the first substrate structure 100 may, as a nonlimited example, undergo rinsing by using a material such as HF.

Figure 15F:
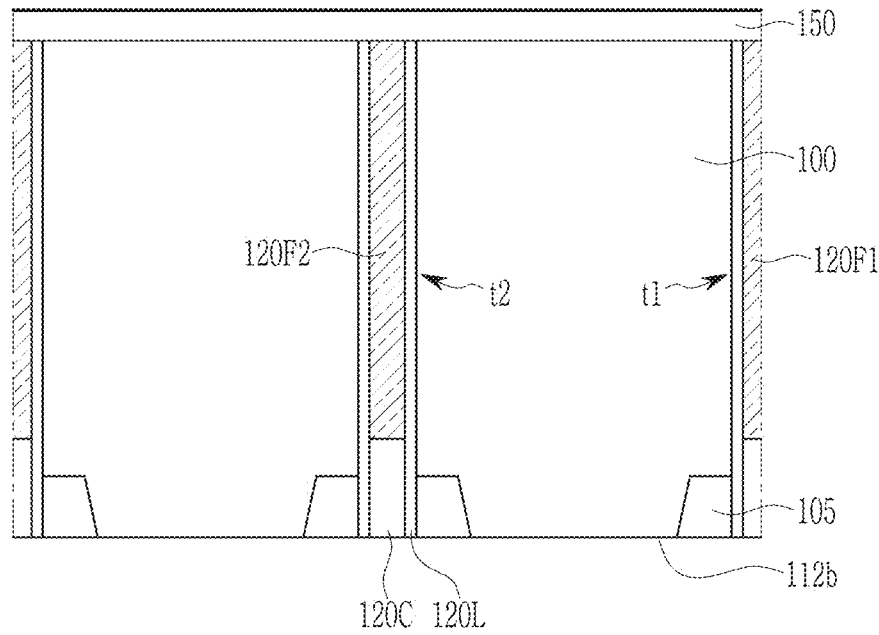

Referring to FIG. 15F, a surface insulation layer 150 may be applied on the rinsed first side 112a.

The surface insulation layer 150 may include an insulating material. For example, the surface insulation layer 150 may include at least one of a silicon oxide, a silicon nitride, a silicon oxynitride, an aluminum oxide, a hafnium oxide, a titanium oxide, a tantalum oxide, or any combination thereof, and is not limited thereto.

Figure 15G:
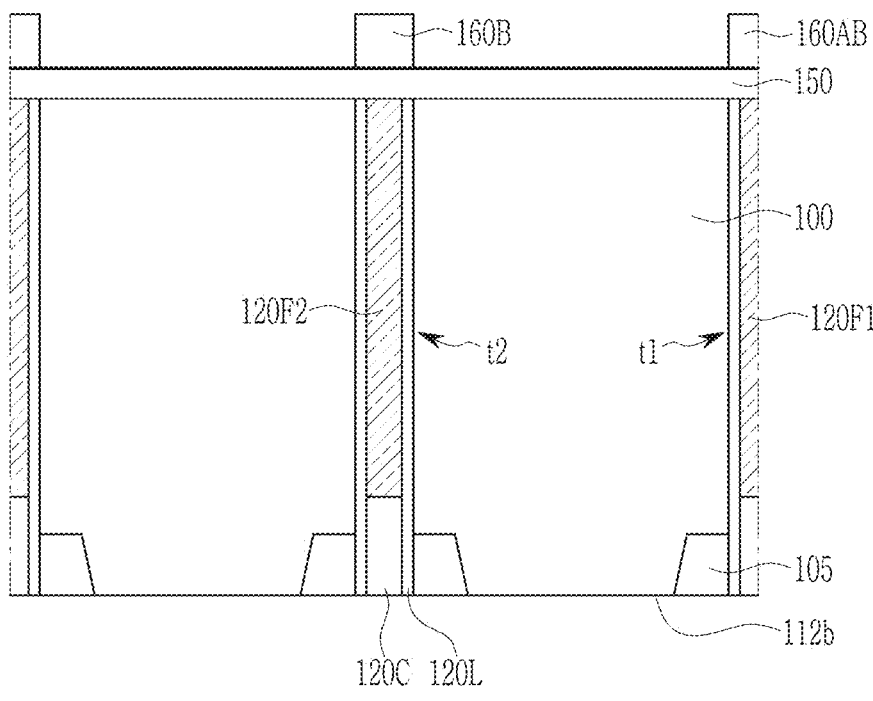

Referring to FIG. 15G, a lower first grid pattern 160AB and a second grid pattern 160B may be formed on the surface insulation layer 150. The lower first grid pattern 160AB and the second grid pattern 160B may be made of the same material, for example, they may be formed according to a depositing or applying process. In some example embodiments, the lower first grid pattern 160AB and the second grid pattern 160B may be deposited or applied with the same height.

Figure 15H:
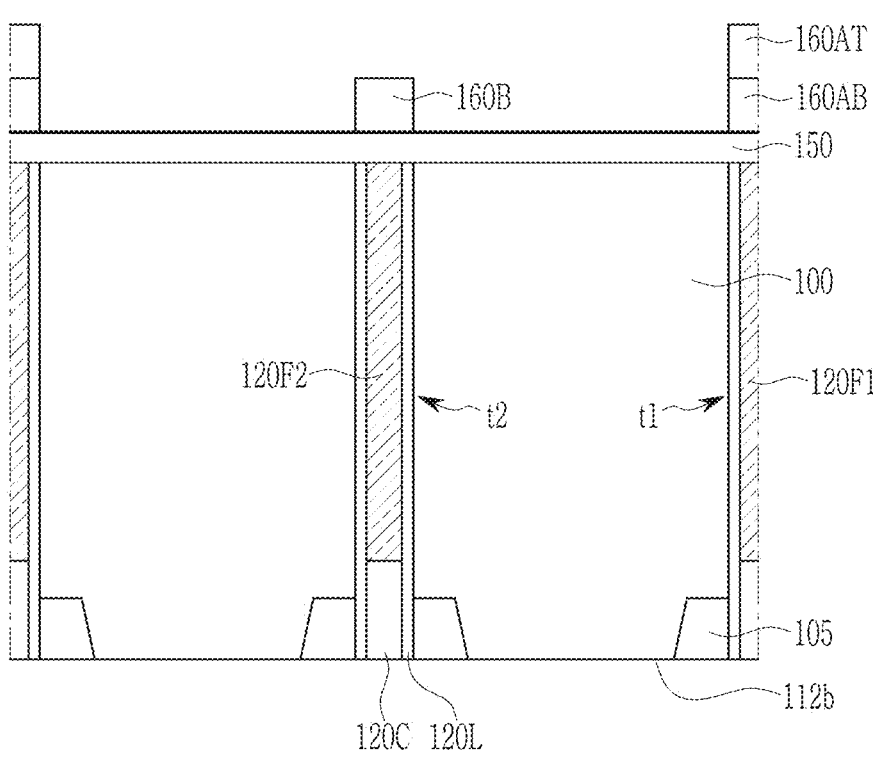

Referring to FIG. 15H, an upper first grid pattern 160AT may be formed on the lower first grid pattern 160AB. As the upper first grid pattern 160AT is deposited or applied on the lower first grid pattern 160AB, the first grid pattern 160A including the upper first grid pattern 160AT and the lower first grid pattern 160AB is formed to be higher than the second grid pattern 160B so when the light is input according to a shift, the incident light may be controlled to be easily input to the photoelectric conversion layers PD1 and PD2.

As the first grid pattern 160A and the second grid pattern 160B are formed as a stack structure, the process may be simplified and the image sensor with a high light yield may be efficiently produced.

As described herein, any devices, systems, units, blocks, circuits, controllers, processors, and/or portions thereof according to any of the example embodiments (including, for example, the semiconductor chip as described herein, the pixel array 102, the logic circuit 202, the row decoder 21, the row driver 22, the timing generator 23, the correlated double sampler 24, the analog to digital converter 25, the latch portion 26, the column decoder 27, the first substrate structure 100, the second substrate structure 200, the third substrate structure 300, the memory device 302, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid-state drive memory device, storing a program of instructions, and a processor (e.g., CPU) configured to execute the program of instructions to implement the functionality and/or methods performed by some or all of any devices, systems, units, blocks, circuits, controllers, processors, and/or portions thereof according to any of the example embodiments.

While the inventive concepts have been described in connection with what is presently considered to be practical example embodiments, it is to be understood that the inventive concepts are not limited to such example embodiments, but, on the contrary, are intended to cover various modifications and equivalent arrangements included within the spirit and scope of the appended claims. Therefore, the example embodiments described above are only examples and should not be construed as being limiting in any respects.

DESCRIPTION OF SYMBOLS

100: first substrate structure
200: second substrate structure
PX: unit pixel region
120A: pixel separating pattern
120B: first separating pattern
150: surface insulation layer
160A: first grid pattern
160B: second grid pattern
160C: third grid pattern

What is claimed is:

1. An image sensor, comprising:
a substrate including a first side configured to receive light and a second side that is opposite the first side;
a pixel separating pattern configured to at least partially define a unit pixel in the substrate;
a first photoelectric conversion layer and a second photoelectric conversion layer arranged in a first direction in the pixel separating pattern;
a first separating pattern configured to at least partially define the first photoelectric conversion layer and the second photoelectric conversion layer in the substrate, the first separating pattern between the first photoelectric conversion layer and the second photoelectric conversion layer;
a first grid pattern on the pixel separating pattern; and
a second grid pattern on the first separating pattern and having a lower height than the first grid pattern.

2. The image sensor of claim 1, wherein
a height of the second grid pattern satisfies a range of $\frac{1}{10}$ to $\frac{1}{4}$ of a height of the first grid pattern.

3. The image sensor of claim 1, wherein
the image sensor includes a first color filter on the first grid pattern and the second grid pattern, a refractive index of the first color filter is a greater refractive index than a refractive index of the second grid pattern.

4. The image sensor of claim 3, wherein
a ratio of the refractive index of the second grid pattern to the refractive index of the first color filter on the second grid pattern satisfies 0.40 to 0.95.

5. The image sensor of claim 1, wherein
a refractive index of the second grid pattern satisfies 1.0 to 1.6.

6. The image sensor of claim 1, wherein
the first grid pattern includes a lower first grid pattern and an upper first grid pattern, the upper first grid pattern on the lower first grid pattern.

7. The image sensor of claim 6, wherein
the lower first grid pattern and the second grid pattern have a same height.

8. The image sensor of claim 6, wherein
the lower first grid pattern and the upper first grid pattern include different materials.

9. The image sensor of claim 1, further comprising:
a third photoelectric conversion layer proximate to the first photoelectric conversion layer in a second direction in the unit pixel, and
a fourth photoelectric conversion layer proximate to the second photoelectric conversion layer in the second direction,
wherein the third photoelectric conversion layer and the fourth photoelectric conversion layer are at least partially defined by the first separating pattern.

10. The image sensor of claim 1, wherein
the first separating pattern includes a first sub-separating pattern and a second sub-separating pattern spaced apart at a particular interval.

11. The image sensor of claim 10, wherein
an area of the second grid pattern is equal to or greater than an area of the first sub-separating pattern and the second sub-separating pattern.

12. The image sensor of claim 1, wherein
the pixel separating pattern is configured to at least partially define an additional unit pixel in the substrate, the additional unit pixel including
an additional first photoelectric conversion layer and an additional second photoelectric conversion layer arranged in the first direction in the pixel separating pattern;
an additional first separating pattern configured to at least partially define the additional first photoelectric conversion layer and the additional second photoelectric conversion layer in the substrate, the additional first separating pattern between the additional first photoelectric conversion layer and the additional second photoelectric conversion layer; and
a third grid pattern, the third grid pattern on at least one of the additional first photoelectric conversion layer of the additional unit pixel or the additional second photoelectric conversion layer of the additional unit pixel.

13. The image sensor of claim 12, wherein
the third grid pattern completely covers the at least one of the additional first photoelectric conversion layer or the additional second photoelectric conversion layer.

14. The image sensor of claim 12, wherein the additional first separating pattern includes a first sub-separating pattern and a second sub-separating pattern spaced apart from each other at a particular interval, and the third grid pattern is on at least part of the first sub-separating pattern or the second sub-separating pattern.

15. The image sensor of claim 14, wherein the third grid pattern completely covers the first sub-separating pattern and the second sub-separating pattern.

16. An image sensor, comprising:

a substrate including a first side configured to receive light and a second side that is opposite the first side;

a pixel separating pattern configured to at least partially define a unit pixel in the substrate;

a first photoelectric conversion layer and a second photoelectric conversion layer arranged in a first direction in the pixel separating pattern;

a first separating pattern configured to at least partially define the first photoelectric conversion layer and the second photoelectric conversion layer in the substrate, the first separating pattern between the first photoelectric conversion layer and the second photoelectric conversion layer; and a first grid pattern on at least one of the first photoelectric conversion layer or the second photoelectric conversion layer.

17. The image sensor of claim 16, wherein the first grid pattern covers at least part of the first separating pattern.

18. The image sensor of claim 16, further comprising:

a second grid pattern between the first separating pattern and the first grid pattern.

19. An image sensor, comprising:

a substrate including a first side configured to receive light and a second side that is opposite the first side;

a pixel separating pattern configured to at least partially define a unit pixel in the substrate;

a first photoelectric conversion layer and a second photoelectric conversion layer arranged in a first direction in the pixel separating pattern;

a first separating pattern configured to at least partially define the first photoelectric conversion layer and the second photoelectric conversion layer in the substrate, the first separating pattern between the first photoelectric conversion layer and the second photoelectric conversion layer;

a surface insulation layer on each of the pixel separating pattern, the first photoelectric conversion layer, the second photoelectric conversion layer, and the first separating pattern;

a first grid pattern on at least a first portion of the surface insulation layer on the pixel separating pattern;

a second grid pattern on at least a second portion of the surface insulation layer on the first separating pattern, the second grid pattern having a lower height than the first grid pattern; and a color filter on each of the first grid pattern and the second grid pattern, wherein a height of the second grid pattern satisfies $\frac{1}{10}$ to $\frac{1}{4}$ of a height of the first grid pattern.

20. The image sensor of claim 19, wherein the pixel separating pattern is configured to at least partially define an additional unit pixel in the substrate, the additional unit pixel including an additional first photoelectric conversion layer and an additional second photoelectric conversion layer arranged in the first direction in the pixel separating pattern;

an additional first separating pattern configured to at least partially define the additional first photoelectric conversion layer and the additional second photoelectric conversion layer in the substrate, the additional first separating pattern between the additional first photoelectric conversion layer and the additional second photoelectric conversion layer; and a third grid pattern on at least one of the additional first photoelectric conversion layer or the additional second photoelectric conversion layer.

\* \* \* \* \*